(12) United States Patent
Odagawa et al.

(10) Patent No.: US 6,778,425 B1
(45) Date of Patent: Aug. 17, 2004

(54) MAGNETORESISTANCE EFFECT MEMORY DEVICE AND METHOD FOR PRODUCING THE SAME

(75) Inventors: Akihiro Odagawa, Nara (JP); Masayoshi Hiramoto, Ikoma (JP); Nozomu Matsukawa, Nara (JP); Hideaki Adachi, Hirakata (JP); Hiroshi Sakakima, Kyotanabe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 224 days.

(21) Appl. No.: 09/856,847
(22) PCT Filed: Sep. 25, 2000
(86) PCT No.: PCT/JP00/06587

§ 371 (c)(1),
(2), (4) Date: Aug. 22, 2001

(87) PCT Pub. No.: WO01/24289

PCT Pub. Date: Apr. 5, 2001

(30) Foreign Application Priority Data

Sep. 27, 1999 (JP) .......................................... 11-272379
Mar. 10, 2000 (JP) ......................................... 2000-66532

(51) Int. Cl.$^7$ ............................................. G11C 11/00
(52) U.S. Cl. ......................... 365/158; 365/171; 365/173
(58) Field of Search ............................... 365/158, 171, 365/173

(56) References Cited

U.S. PATENT DOCUMENTS 5,448,515 A 9/1995 Fukami et al. ............... 365/171
5,981,054 A * 11/1999 Hikosaka et al. ............ 428/328
6,219,275 B1 * 4/2001 Nishimura ................... 365/173
6,480,411 B1 * 11/2002 Koganei ...................... 365/158
6,538,297 B2 * 3/2003 Odagawa et al. ............ 257/421

FOREIGN PATENT DOCUMENTS

| EP | 0 844 679 A1 | 5/1998 |
| EP | 0 959 475 A2 | 11/1999 |
| JP | 6-73526 | 3/1994 |
| WO | WO 97/39488 | 10/1997 |

OTHER PUBLICATIONS

"Quarternary Giant Magnetoresistance Random Access Memory", Zhigang Wang and Yoshihisa Nakamura, Research Institute of Electrical Communication, Tohoku University, Sendai 980, Japan—J. Appl. Phys. 79 (8), Apr. 15, 1996, pp. 6639–6641.

* cited by examiner

*Primary Examiner*—Richard Elms
*Assistant Examiner*—Hien Nguyen
(74) *Attorney, Agent, or Firm*—Snell & Wilmer, LLP

(57) ABSTRACT

A magneto-resistive effect memory element according to the present invention includes a first ferromagnetic film; a second ferromagnetic film; a first nonmagnetic film provided between the first ferromagnetic film and the second ferromagnetic film, a first conductive film for generating a magnetic field for causing magnetization inversion in at least one of the first ferromagnetic film and the second ferromagnetic film, the first conductive film not being electrically in contact with the first ferromagnetic film or the second ferromagnetic film; and a second conductive film and a third conductive film for supplying an electric current to the first ferromagnetic film, the first nonmagnetic film, and the second ferromagnetic film. The first ferromagnetic film and the second ferromagnetic film have different magnetization inversion characteristics with respect to the magnetic field, and the first nonmagnetic film contains at least a nitride.

51 Claims, 22 Drawing Sheets

MAGNETORESISTANCE EFFECT MEMORY DEVICE AND METHOD FOR PRODUCING THE SAME

TECHNICAL FIELD

The present invention relates to a magneto-resistive effect element (hereinafter, referred to as "MR"), in particular to a microscopic magneto-resistive effect element, a magneto-resistive effect magnetic head, a microscopic magneto-resistive effect memory element, and a high density magneto-resistive effect memory device including such magneto-resistive effect memory elements in a matrix.

BACKGROUND ART

A magnetic random access memory (MRAM) using a magneto-resistive (MR) film was proposed by L. J. Schwee, Proc. INTERMAG Conf. IEEE Trans. on Magn. Kyoto (1972) pp. 405. Various types of MRAMs including word lines as current lines for generating a magnetic field and sense lines using MR films for reading data have been studied. One of such studies is described in A. V. Pohm et al., IEEE Trans. on Magn. 28 (1992) pp. 2356. Such memory devices generally use an NiFe film or the like exhibiting an anisotropic MR effect (AMR) having an MR change ratio of about 2%, and thus the level of an output signal needs to be improved.

M. N. Baibich et al., Phys. Rev. Lett. 61 (1988) pp. 2472 describes that an artificial lattice film formed of magnetic films exchange-coupled through a nonmagnetic film to each other exhibits a giant MR effect (GMR). K. T. M. Ranmuthu et al., IEEE Trans. on Magn. 29 (1993) pp. 2593 proposes an MRAM using a GMR film formed of magnetic films anti-ferromagnetically exchanged-coupled to each other. The GMR film exhibits a relatively large MR change ratio, but disadvantageously requires a larger magnetic field to be applied and thus requires a larger current for writing and reading information than an AMR film.

One exemplary type of non-coupling GMR film is a spin valve film. B. Dieny et al., J. Magn. Magn. Mater. 93(1991) pp. 101 describes a spin valve film using an antiferromagnetic film. H. Sakakima et al., Jpn. J. Appl. Phys. 33 (1994) pp. L1668 describes a spin valve film using a semi-hard magnetic film. These spin valve films require a magnetic field as small as that required by the AMR films and still exhibit a larger MR change ratio than the AMR films. Y. Irie et al., Jpn. J. Appl. Phys. 34 (1995) pp. L415 describes an MRAM, formed of a spin valve film using an antiferromagnetic film or a hard magnetic film, which performs a non-destructive read out (NDRO).

The nonmagnetic film used for the above-described GMR films is a conductive film formed of Cu or the like. Tunneling GMR films (TMR) using $Al_2O_3$, MgO or the like as the nonmagnetic film have actively been studied, and MRAMs using the TMR film have been proposed.

It is known that the MR effect provided when a current flows perpendicular to the surface of a GMR film (CPPMR) is larger than the MR effect provided when a current flows parallel to the surface of the GMR film (CIPMR). A TMR film, which has a relatively high impedance, is expected to provide a sufficiently large output.

However, the tunnel junction of a TMR film has a problem in that the junction impedance gradually increases as the size of the element is reduced.

When the size of a memory cell including the tunnel junction is small to the order of submicrons, the junction impedance becomes excessively high such that the signals cannot be read. Accordingly, a tunnel insulating body capable of providing a desirable junction resistance is demanded.

When the scattering of electrons at the tunnel junction interface of the tunnel junction element is excessively strong, desirable element characteristics are not obtained. Thus, the state of the tunnel junction interface significantly influences the junction characteristics.

In a conventional TMR films it is common to form the tunnel junction using $Al_2O_3$ as a nonmagnetic insulating layer. In order to obtain satisfactory insulating characteristics, such a nonmagnetic insulating layer is formed of spontaneous oxidation or plasma oxidation of a metal Al film.

However, such production methods have a possibility that a metal layer and an insulating layer are mixed in a nonmagnetic layer and a possibility that a ferromagnetic layer is also oxidized resulting in formation of an unnecessary insulating layer. These defects cause deterioration in the tunnel characteristics.

As the size of a tunnel junction element is reduced, the resistance (impedance) of the tunnel junction element is required to be decreased. It is very difficult to form a tunnel junction having a tunnel junction resistance of 10 $\Omega\mu m^2$ or less using $Al_2O_3$ as a nonmagnetic layer.

In light of the above-described problems, the present invention has an objective of providing a magneto-resistive element, a magneto-resistive effect magnetic head, and a magneto-resistive effect memory element having a reduced tunnel junction resistance and an ideal tunnel junction interface; and a magneto-resistive effect memory device including such magneto-resistive effect memory elements in a matrix.

DISCLOSURE OF THE INVENTION

A magneto-resistive effect memory element according to the present invention includes a first ferromagnetic film; a second ferromagnetic film: a first nonmagnetic film provided between the first ferromagnetic film and the second ferromagnetic film; a first conductive film for generating a magnetic field for causing magnetization inversion in at least one of the first ferromagnetic film and the second ferromagnetic film, the first conductive film not being electrically in contact with the first ferromagnetic film or the second ferromagnetic film; and a second conductive film and a third conductive film for supplying an electric current to the first ferromagnetic film, the first nonmagnetic film, and the second ferromagnetic film. The first ferromagnetic film and the second ferromagnetic film have different magnetization inversion characteristics with respect to the magnetic field, and the first nonmagnetic film contains at least a nitride. Thus, the above-described objective is achieved.

At least one of the first ferromagnetic film and the second ferromagnetic film may contain a nitride.

At least one of the first ferromagnetic film and the second ferromagnetic film may contain a nitride which contains at least one of Fe and Co as a main component.

At least one of the second conductive film and the third conductive film may contain a nitride.

At least one of the second conductive film and the third conductive film may contain TiN.

The first nonmagnetic film may have a thickness of 0.5 nm to 4 nm.

The first nonmagnetic film may contain AlN.

The first nonmagnetic film may contain BN.

The first nonmagnetic film may contain InN.

The first nonmagnetic film may contain at least M—N—(O) where M is at least one metal element of Al, B and In, N is a nitrogen element, and (O) is an oxygen element contained in the nitride.

The first nonmagnetic film may be formed by nitriding a nonmagnetic metal material.

The first nonmagnetic film may further contain an oxide.

A method, according to the present invention, for producing the above-described magneto-resistive effect memory element includes a first step of forming the first nonmagnetic film by nitriding a nonmagnetic metal material in a nitrogen atmosphere; and a second step of oxidizing the first nonmagnetic film in an oxygen atmosphere.

At least one of the first step and the second step may be performed a plurality of times.

The method according to the present invention may further include a third step of forming the first ferromagnetic film: and a fourth step of forming the second ferromagnetic film.

The first nonmagnetic film mainly may contain M—N, and may mainly contain M—O in a grain boundary thereof.

A method, according to the present invention, for producing the above-described magneto-resistive effect memory element includes a first step of forming the first nonmagnetic film by nitriding the metal element in a nitrogen atmosphere; and a second step of oxidizing the first nonmagnetic film in an oxygen atmosphere.

At least one of the first step and the second step may be performed a plurality of times.

The method according to the present invention may further includes a third step of forming the first ferromagnetic film; and a fourth step of forming the second ferromagnetic film.

The first nonmagnetic film may mainly contain M—N, and may also contain M—O in a dispersed manner.

A method, according to the present invention, for producing the above-described magneto-resistive effect memory element includes a first step of forming the first nonmagnetic film by nitriding the metal element in a nitrogen atmosphere; and a second step of oxidizing the first nonmagnetic film in an oxygen atmosphere.

At least one of the first step and the second step may be performed a plurality of times.

The method according to the present invention may further include a third step of forming the first ferromagnetic film; and a fourth step of forming the second ferromagnetic film.

The first nonmagnetic film may mainly include at least one M—N film and at least one M—O film, where M is at least one metal element of Al, B and In, N is a nitrogen element, and O is an oxygen element.

A method, according to the present invention, for producing the above-described magneto-resistive effect memory element includes a first step of forming the at least one M—N film by nitriding the metal element in a nitrogen atmosphere; and a second step of forming the at least one M—O film by oxidizing the metal element in an oxygen atmosphere.

At least one of the first step and the second step may be performed a plurality of times.

The method according to the present invention may further include a third step of forming the first ferromagnetic film; and a fourth step of forming the second ferromagnetic film.

An MRAM device according to the present invention includes a plurality of above-described magneto-resistive effect memory elements. A plurality of first conductive films, a plurality of second conductive films, and a plurality of third conductive films are each located in a prescribed direction.

A magneto-resistive effect memory element according to the present invention includes a plurality of stacking structures; at least one first nonmagnetic film provided between the plurality of stacking structures; and a first conductive film and a second conductive film for supplying an electric current to the plurality of stacking structures. The plurality of stacking structures each have a first ferromagnetic film, a second ferromagnetic film, and a second nonmagnetic film provided between the first ferromagnetic film and the second ferromagnetic film. The first ferromagnetic film and the second ferromagnetic film have different magnetization inversion characteristics with respect to a magnetic field. The magneto-resistive effect memory element further includes a third conductive film for generating a magnetic field for causing magnetization inversion in at least one of the first ferromagnetic films and the second ferromagnetic films included in the plurality of stacking structures, the third conductive film not being electrically in contact with the first ferromagnetic films or the second ferromagnetic films. At least one of the second nonmagnetic films included in the plurality of stacking structures contains at least a nitride.

The first ferromagnetic films may have different magnitudes of magnetic coersive forces.

The second ferromagnetic films may have different magnitudes of magnetic coersive forces.

The at least one of the first ferromagnetic films and the second ferromagnetic films may contain a nitride.

At least one of the first ferromagnetic films and the second ferromagnetic films may contain a nitride which contains at least one of Fe and Co as a main component.

The at least one of the first conductive film and the second conductive film may contain a nitride.

The at least one of the first conductive film and the second conductive film may contain TiN.

At least one of the second nonmagnetic films may contain at least M—N—(O) where M is at least one metal element of Al, B and In, N is a nitrogen element, and (O) is an oxygen element contained in the nitride.

At least one of the second nonmagnetic films may be formed by nitriding a nonmagnetic metal material.

At least one of the second nonmagnetic films may contain an oxide.

An MRAM device according to the present invention includes a plurality of above-described magneto-resistive effect memory elements. A plurality of first conductive films, a plurality of second conductive films, and a plurality of third conductive films are each located in a prescribed direction.

A magneto-resistive effect element according to the present invention includes a first ferromagnetic film; a second ferromagnetic film; and a first nonmagnetic film provided between the first ferromagnetic film and the second ferromagnetic film. The first ferromagnetic film and the second ferromagnetic film have different magnetization inversion characteristics with respect to a magnetic field. The first nonmagnetic film contains at least a nitride.

At least one of the first ferromagnetic film and the second ferromagnetic film may contain a nitride.

At least one of the first ferromagnetic film and the second ferromagnetic film may contain a nitride which contains at least one of Fe and Co as a main component.

The first nonmagnetic film may have a thickness of 0.5 nm to 4 nm.

The first nonmagnetic film may contain AlN.

The first nonmagnetic film may contain BN.

The first nonmagnetic film may contain InN.

The first nonmagnetic film may contain at least M—N—(O) where M is at least one metal element of Al, B and In, N is a nitrogen element, and (O) is an oxygen element contained in the nitride.

The first nonmagnetic film may be formed by nitriding a nonmagnetic metal material.

The first nonmagnetic film may further contain an oxide.

A method, according to the present invention, for producing the above-described magneto-resistive effect element includes a first step of forming, the first nonmagnetic film by nitriding a nonmagnetic metal material in a nitrogen atmosphere: and a second step of oxidizing the first nonmagnetic film in an oxygen atmosphere.

At least one of the first step and the second step may be performed a plurality of times.

The method according to the present invention may further include a third step of forming the first ferromagnetic film; and a fourth step of forming the second ferromagnetic film.

The first nonmagnetic film may mainly contain M—N, and may mainly contain M—O in a grain boundary thereof.

A method, according to the present invention, for producing the above-described magneto-resistive effect element includes a first step of forming the first nonmagnetic film by nitriding the metal element in a nitrogen atmosphere; and a second step of oxidizing the first nonmagnetic film in an oxygen atmosphere.

At least one of the first step and the second step may be performed a plurality of times.

The method according to the present invention may further include a third step of forming the first ferromagnetic film; and a fourth step of forming the second ferromagnetic film.

The first nonmagnetic film may mainly contain M—N, and may also contain M—O in a dispersed manner.

A method, according to the present invention, for producing the above-described magneto-resistive effect element includes a first step of forming the first nonmagnetic film by nitriding the metal element in a nitrogen atmosphere; and a second step of oxidizing the first nonmagnetic film in an oxygen atmosphere.

At least one of the first step and the second step is performed a plurality of times.

The method according to the present invention may further include a third step of forming the first ferromagnetic film; and a fourth step of forming the second ferromagnetic film.

The first nonmagnetic film may mainly include at least one M—N film and at least one M—O film, where M is at least one metal element of Al, B and In, N is a nitrogen element, and O is an oxygen element.

A method, according to the present invention, for producing the above-described magneto-resistive effect element includes a first step of forming the at least one M—N film by nitriding the metal element in a nitrogen atmosphere; and a second step of forming the at least one M—O film by oxidizing the metal element in an oxygen atmosphere.

At least one of the first step and the second step may be performed a plurality of times.

The method according to the present invention may further include a third step of forming the first ferromagnetic film; and a fourth step of forming the second ferromagnetic film.

A method, according to the present invention, for producing a metal insulating film containing at least a nitride includes a first step of forming the nitride by nitriding a prescribed metal material in a nitrogen atmosphere; and a second step of oxidizing the nitride in an oxygen atmosphere.

The prescribed metal material may be at least one of Al, B and In.

At least one of the first step and the second step may be performed a plurality of times.

A method, according to the present invention, for producing a metal insulating film including at least one M—N film and at least one M—O film where M is a prescribed metal element, N is a nitrogen element, and O is an oxygen element includes a first step of forming the at least one M—N film by nitriding the metal element in a nitrogen atmosphere; and a second step of forming the at least one M—O film by oxidizing the metal element in an oxygen atmosphere.

The prescribed metal element may be at least one of Al, B and In.

At least one of the first step and the second step may be performed a plurality of times.

A feature of the present invention is to use a nitride for a nonmagnetic insulating film, and also for a magnetic film. In this manner, a magneto-resistive element, a magneto-resistive effect magnetic head, a magneto-resistive effect memory element, and a high density magneto-resistive effect memory device including such magneto-resistive effect memory elements in a matrix, which have a reduced tunnel junction resistance and an ideal tunnel junction interface, are provided.

Especially, the nonmagnetic insulating film is formed of a combination of a nitride and an oxide. Thus, the advantage of a low tunnel junction resistance of the nonmagnetic insulating film formed of a nitride can be used. In addition, an incompletely nitrided portion of the nonmagnetic insulating film, which tends to be made as a result of dispersion in the production conditions, is oxidized so as to increase the resistance of the incompletely nitrided portion. Thus, a leak conveying path or a hopping conveyance path can be prevented from appearing. In the case where the nonmagnetic insulating film is formed by repeating a nitriding step and an oxidizing step in repetition, the controllability of the tunnel characteristics can be further improved.

According to the present invention, a low junction resistance, which is equivalent to a tunnel junction resistance obtained by using $Al_2O_3$ for the nonmagnetic insulating film, is realized with a thicker nonmagnetic insulating film. Therefore, the MR portion can be more easily produced, which is advantageous in uniformizing the characteristics of memory cells which are required to be highly integrated.

BRIEF DESCRIPTION OF THE DRAWINGS

FIGS. 8A, 8B, 5C and 8D are cross-sectional views of a magneto-resistive effect memory cell in an example according to the present invention.

BEST MODE FOR CARRYING OUT THE INVENTION

EXAMPLE 1

Figure 1:
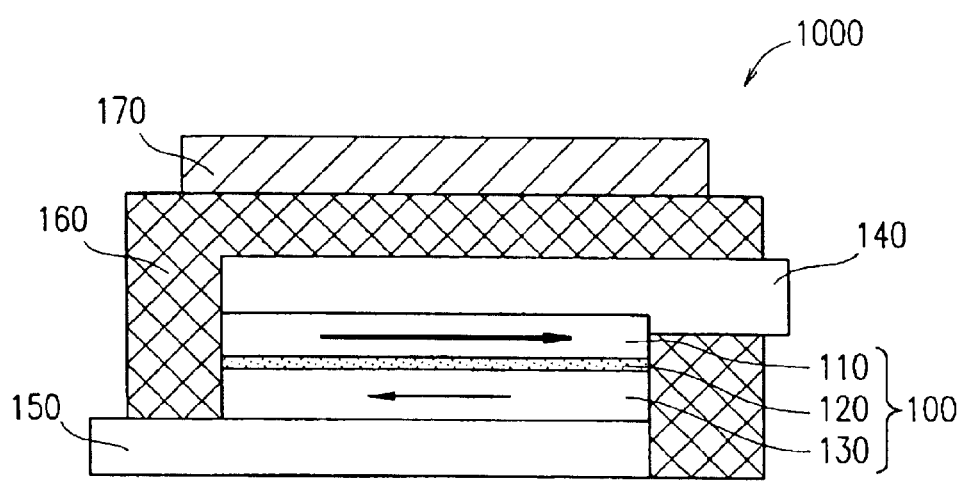
FIG. 1 is a cross-sectional view of a magneto-resistive effect memory cell in one example according to the present invention.

FIG. 1 shows a cross-sectional view of a magneto-resistive effect memory cell 1000 in a first example according to the present invention.

The magneto-resistive effect memory cell 1000 is a spin valve-type magneto-resistive effect memory cell using a hard magnetic film (hereinafter, referred to as an "HM spin valve-type magneto-resistive effect memory cell").

The magneto-resistive effect memory cell 1000 includes an MR portion 100. The MR portion 100 includes a hard magnetic film 110 (second ferromagnetic film), a nonmagnetic insulating film 120, and a soft magnetic film 130 (first ferromagnetic film). The soft magnetic film 130 is more easily magnetization-rotated by an external magnetic field than the hard magnetic film 110. The MR portion 100 is connected with conductive films 140 and 150. The conductive films 140 and 150 respectively act as a part of a sense line and a bit line, or vice versa. A conductive film 170 is provided above the MR portion 100 with an insulating film 160 interposed therebetween. The conductive film 170 acts as a part of a word line.

In the drawings attached to this specification, the arrows shown in magnetic films represent the directions of the magnetization of the respective magnetic films. It should be noted that the magnetization direction of each magnetic film is not limited to the magnetization direction shown in the drawings and is variable in various examples. The magnetization direction can also be changed by a write operation and a read operation.

The magneto-resistive effect memory cell 1000 operates as follows. Information is written by causing magnetization inversion of the hard magnetic film 110 by a magnetic field generated by a current which flows in the conductive film 170 (word line). Information is read by causing magnetization inversion of the soft magnetic film 130 without causing magnetization inversion of the hard magnetic film 110. A magnetic field can be generated by supplying a current to the conductive film 140 or 150, which acts as the sense line, in addition to the conductive film 170. In this case, it is preferable that the sense line, formed of a plurality of conductive films 140 or conductive films 150, and the word lines, formed of a plurality of conductive films 170, are perpendicular to each other.

Such an information write and read operation realizes a non-destructive read out (NDRO) of the magneto-resistive effect memory cell 1000. In this case, magnetization inversion requires two magnetic field strength threshold values, i.e., a writing threshold value Hh and a reading threshold value Hs which respectively correspond to a magnetic coercive force of the hard magnetic film 110 and a magnetic coercive force of a soft magnetic film 130.

Figure 2A:
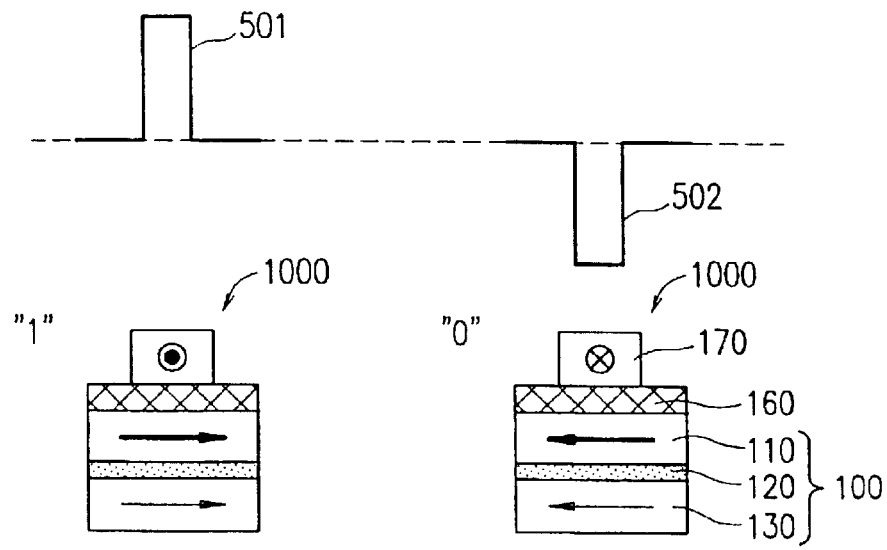
FIGS. 2A and 2B show an operation principle of the magneto-resistive effect memory cell in an example according to the present invention.
Figure 2B:
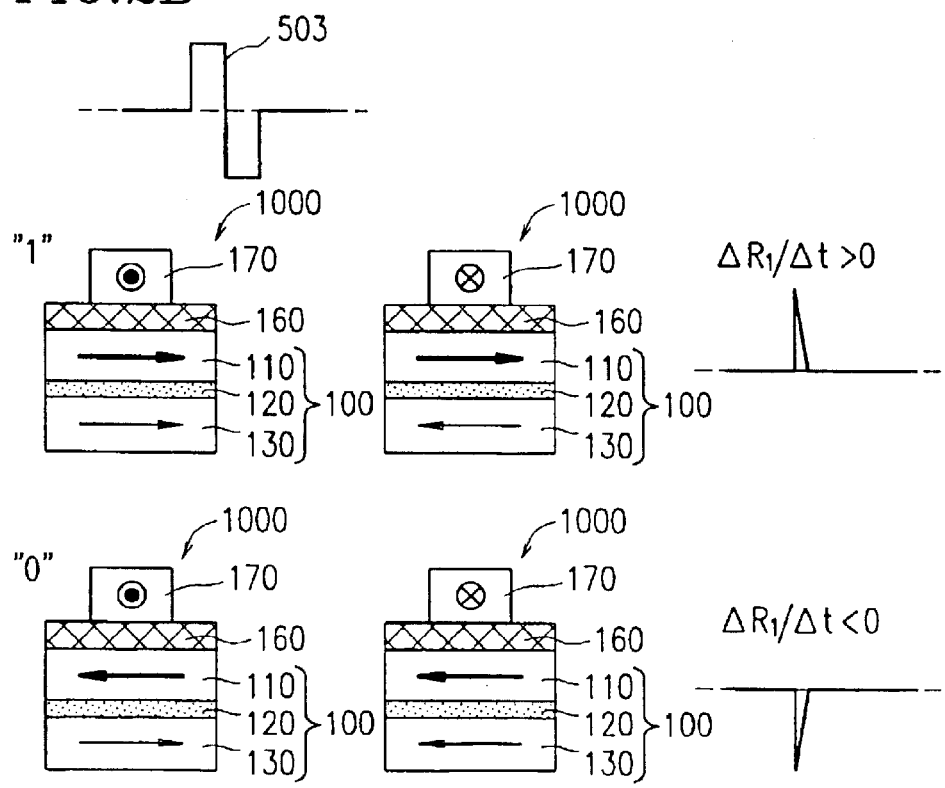

FIGS. 2A and 2B show an operation principle of the HM spin valve-type magneto-resistive effect memory cell 1000.

A signal or data is written in the magneto-resistive effect memory cell 1000 as follows. As shown in FIG. 2A, a positive pulse current 501 or a negative pulse current 502 is caused to flow in the conductive film 170 to apply a magnetic field which exceeds the writing threshold value Hh of the hard magnetic film 110 to the hard magnetic film 110, thus causing magnetization inversion of the hard magnetic film 110. The level of the signal, i.e., "1" or "0" is written corresponding to the magnetization direction of the hard magnetic film 110.

The written signal or data is read as follows. While a constant current flows in the conductive films 140 and 150 (FIG. 1), a weak pulse current is caused to flow in the conductive film 170, thus generating a magnetic field having a strength which is equal to or more than the threshold value Hs of the soft magnetic film 130 and is equal to or less than the threshold value Hh of the hard magnetic film 110. The signal is read by determining whether the magnetization inversion of the soft magnetic film 130 is caused or not. Specifically., the level of the signal, i.e., the data storage state is identified to be "1" or "0" by monitoring a change in the resistance value of the MR portion 100 through the conductive films 140 and 150.

For example, when a current similar to the positive pulse current 501 is caused to flow in the conductive film 170 while the magneto-resistive effect memory cell 1000 is in the data storage states of "1" (FIG. 2A), the resistance value of the magneto-resistive portion 100 is not changed. When a current similar to the positive pulse current 501 is caused to flow in the conductive film 170 while the magneto-resistive effect memory cell 1000 is in the data storage state of "0" (FIG. 2A), the resistance value of the magneto-resistive portion 100 increases. When a current similar to the negative pulse current 502 is caused to flow in the conductive film 170, the result is opposite to the above.

As shown in FIG. 2B, when a pulse current 503 having a combination of positive and negative pulses is caused to flow in the conductive film 170 while the magneto-resistive effect memory cell 1000 is in the data storage state of "1", the resistance value of the magneto-resistive portion 100 changes from 0 to a positive value. Thus, the change ratio ($\Delta R_1/\Delta t$) is positive. By contrast, when the pulse current 503 is caused to flow in the conductive film 170 while the magneto-resistive effect memory cell 1000 is in the data storage state of "0", the change ratio ($\Delta R_1/\Delta t$) is negative. It should be noted that the pulse current 503 has a level which does not cause magnetization inversion of the hard magnetic film 110 but can cause magnetization inversion of the soft magnetic film 130.

The above-described operation principle allows a signal to be read from the magneto-resistive effect memory cell 1000. In an HM spin valve-type magneto-resistive effect memory cell such as the magneto-resistive effect memory cell 1boo, the magnetization state of the hard magnetic film 110 does not change while a signal is being read and thus an NDRO is possible.

A semi-hard magnetic film is usable instead of the hard magnetic film 110.

The hard magnetic film 110 and the soft magnetic film 130 can be located opposite of each other. Especially when the conductive film 170 is used for applying a magnetic field to the MR portion 100, the soft magnetic film 130 is preferably located as close as possible to the conductive film 170.

Herein, an example of a so-called constant current mode is described, in which a change in the resistance value occurring while a constant current is applied is detected as a voltage change. Alternatively, a so-called constant voltage mode is usable, in which a change in the current level occurring while a constant voltage is applied is detected as a current change.

The structure of the magneto-resistive effect memory cell 1000 is usable as a magneto-resistive effect element. The magneto-resistive effect element is usable as a magnetic head, and a magnetic field applied from a recording medium or the like is sensed by the MR portion 100. The conductive film 170 can be eliminated when the MR effect element is used as a magnetic head.

EXAMPLE 2

Figure 3:
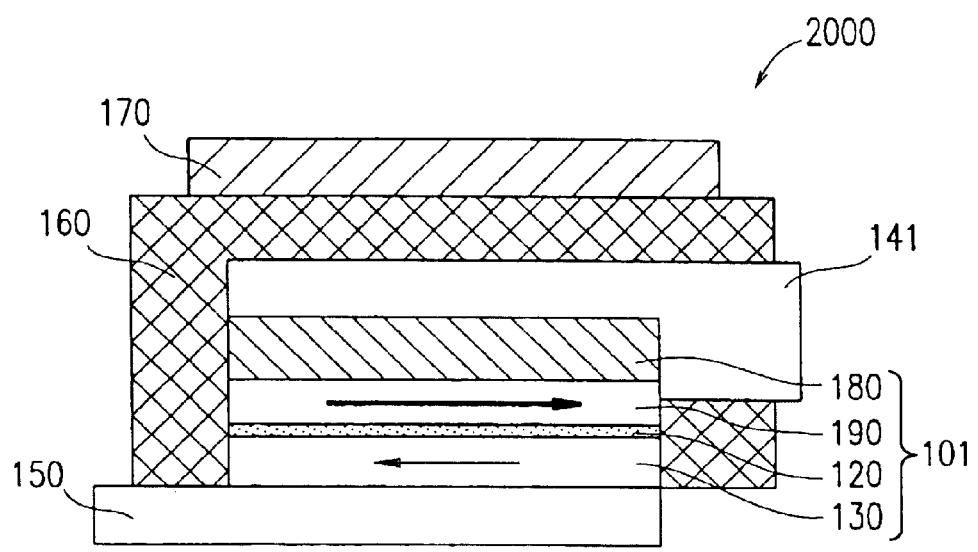
FIG. 3 is a cross-sectional view of a magneto-resistive effect memory cell in a example according to the present invention.

FIG. 3 shows a cross-sectional view of a magneto-resistive effect memory cell 2000 in a second example according to the present invention. Throughout this specification, identical elements previously discussed with respect to the magneto-resistive effect memory cell 1000 bear identical reference numerals and the detailed descriptions thereof will be omitted.

The magneto-resistive effect memory cell 2000 is a spin valve-type magneto-resistive effect memory cell using an antiferromagnetic film (hereinafter, referred to as an "AF spin valve-type magneto-resistive effect memory cell").

The magneto-resistive effect memory cell 2000 includes an MR portion 101. The MR portion 101 includes a ferromagnetic film 190 (second ferromagnetic film) exchange-coupled with an antiferromagnetic film 180, a nonmagnetic insulating film 120, and a soft magnetic film 130 (first ferromagnetic film). The MR portion 101 is electrically connected with conductive films 141 and 150. The soft magnetic film 130 is more easily magnetization-rotated by an external magnetic field than the ferromagnetic film 190. The conductive films 141 and 150 respectively act as a part of a sense line and a bit line, or vice versa.

A magnetic field generated by a current flowing in a conductive film 170 (acting as a part of a word line) does not cause magnetization inversion in the ferromagnetic film 190 but causes magnetization inversion only in the soft magnetic film 130 which is magnetically separated from the ferromagnetic film 190 by the nonmagnetic insulating film 120. Accordingly, information write and read is performed only by magnetization inversion of the soft magnetic film 130. Therefore, although it is difficult to realize an NDRO, there is only one magnetic field threshold value required for causing magnetization inversion and thus the operation principle is simple.

Figure 4A:
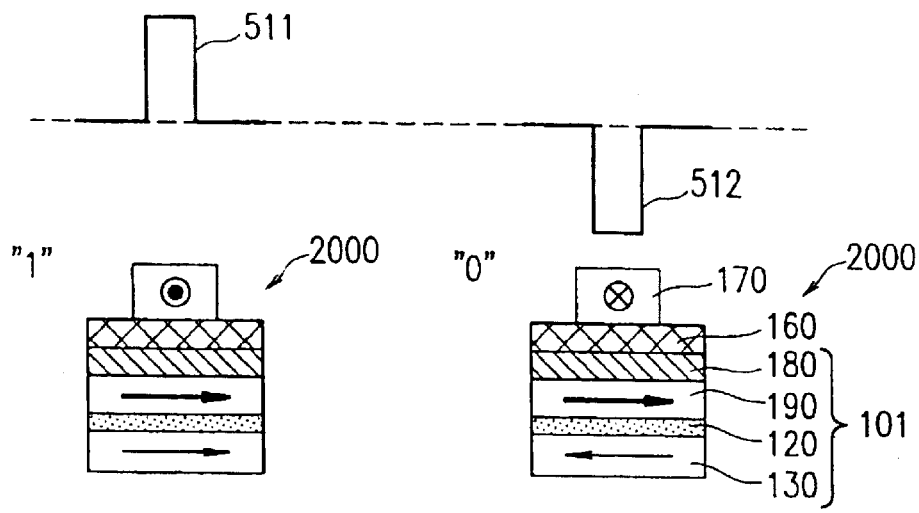
FIGS. 4A, 4B and 4C show an operation principle of the magneto-resistive effect memory cell in an example according to the present invention.
Figure 4B:
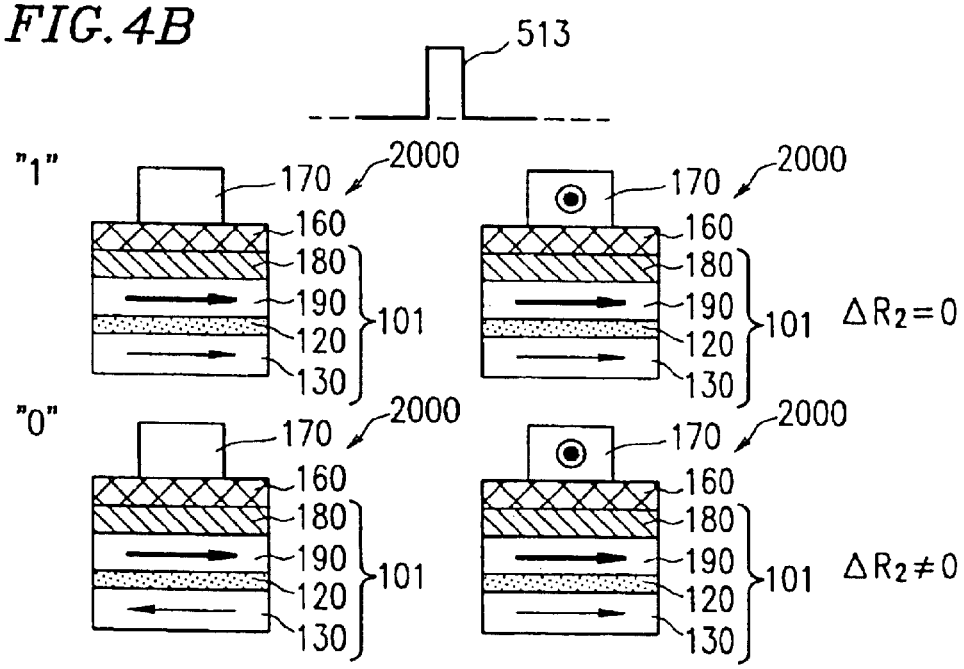

FIGS. 4A and 4B show an operation principle of the magneto-resistive effect memory cell 2000.

The ferromagnetic film 190 is exchange-coupled with the antiferromagnetic 180, and the magnetization of the ferromagnetic film 190 is pinned in one direction.

A signal or data is written in the magneto-resistive effect memory cell 2000 as follows. As shown in FIG. 4A, a positive pulse current 511 or a negative pulse current 512 is caused to flow in the magnetic film 170 to apply a magnetic field which is equal to or more than the reading threshold value Hs of the soft magnetic film 130 to the soft magnetic film 130, thus causing magnetization inversion of the soft magnetic film 130. The level of the signal, i.e. "1" or "0" is written corresponding to the magnetization direction of the soft magnetic film 130.

The written signal or data is read as follows. While a constant current flows in the conductive films 141 and 150 (FIG. 3), a positive or negative weak pulse current is caused to flow in the conductive film 170, thus generating a magnetic field having a strength which is equal to or more than the threshold value Hs of the soft magnetic film 130. The signal is read by determining whether the magnetization inversion of the soft magnetic film 130 is caused or not. Specifically, the level of the signal, i.e., the data storage state is identified to be "1" or "0" by monitoring a change in the resistance value of the MR portion 101 through the conductive films 141 and 150.

For example, when a positive pulse current 513 is caused to flow in the conductive film 170 while the magneto-resistive effect memory cell 2000 is in the data storage states of "1" (FIG. 4B), the resistance of the MR portion 101 is not changed ($\Delta R_2 = 0$). When the positive pulse current 513 is caused to flow in the conductive film 170 while the magneto-resistive effect memory device 2000 is in the data storage state of "0" (FIG. 4B), the resistance of the MR portion 101 changes ($\Delta R_2 \neq 0$). When a negative pulse current (not shown) is caused to flow in the conductive film 170, the result is opposite to the above. It should be noted that the pulse current 513 has a level which does not cause magnetization inversion of the hard magnetic film 190 but can cause magnetization inversion of the soft magnetic film 130.

The above-described operation principle allows a signal to be read from the magneto-resistive effect memory cell 2000. In an AF spin valve-type magneto-resistive effect memory cell such as the magneto-resistive effect memory cell 2000, the signal which has been written is destroyed when the signal is read. Accordingly, an NDRO is difficult to be realized.

However, the NDRO is not impossible even in an AF spin valve-type memory cell such as a magneto-resistive effect memory cell 2000. A specific method for realizing an NDRO will be described below with reference to FIG. 4C. When a signal is read by a method of detecting a difference $\Delta R_3$ between the resistance value of the MR portion 101 and a reference resistance value $R_1$, the state of the signal, i.e., "1" or "0" can be read without supplying a pulse current to the conductive film 170. Since the signal which is written is not destroyed when being read in this case, an NDRO can be realized. The reference resistance value $R_1$ is preferably a value in the variable range of values of the resistance of the MR portion 101. When a plurality of magneto-resistive effect memory cells are integrated, a resistance value of one of the plurality of magneto-resistive effect memory cells is preferably used as the reference resistance value $R_1$.

As an antiferromagnetic film 180, a magnetization rotation prevention film is usable.

A laminate structure obtained by combining the ferromagnetic film 190 and the antiferromagnetic film 180, and the soft magnetic film 130 can be located opposite of each other.

The structure of the magneto-resistive effect memory cell 2000 is usable as a magneto-resistive effect element as in the first example.

The hard magnetic film 110 (FIG. 1) of the magneto-resistive effect memory cell 1000 in the first example and the ferromagnetic film 190 (FIG. 3) of the magneto-resistive effect memory cell 2000 in the second example correspond to a pinned layer of a magneto-resistive effect element. Exemplary suitable metal and alloy materials used for the hard magnetic film 110 and the ferromagnetic film 190 include Co, Fe, Co—Fe, Ni—Fe, and Ni—Fe—Co. Specifically, Co, Fe and a Co—Fe alloy are suitable for obtaining a high MR ratio, and thus Co, Fe or a Co—Fe alloy is preferably used for an interface between the hard magnetic film 110 or ferromagnetic film 190 and the nonmagnetic insulating film 120.

The nonmagnetic layer 120 is preferably formed of an insulating material of a nitride. More preferably, in order to improve the compatibility at the interface, the hard magnetic film 110 and the ferromagnetic film 190 are also formed of a nitride of Co. Fe or Co—Fe.

XMnSb (X is preferably at least one element selected from the group consisting of Ni, Pt, Pd and Cu) has a sufficiently high magnetic polarization ratio and thus provides a sufficiently high MR ratio when used in an MR effect element.

Exemplary suitable oxide magnetic materials used for the hard magnetic film 110 and the ferromagnetic film 190 include $MFe_2O_4$ (M is preferably at least one element selected from the group consisting of Fe, Co and Ni). $MFe_2O_4$ is ferromagnetic up to a relatively high temperature. Co-rich or Ni-rich $MFe_2O_4$ has a higher resistance value than Fe-rich $MFe_2O_4$. Co-rich $MFe_2O_4$ has a relatively large magnetic anisotropy. The hard magnetic film 110 and the ferromagnetic film 190 having desirable characteristics can be obtained by adjusting the composition ratio of the components.

The soft magnetic film 130 preferably has a thickness of about 1 nm or more and about 10 nm or less. When the soft magnetic film 130 is too thick, the MR ratio is reduced due to a shunt effect: whereas when the film is too thin, the soft magnetic characteristics are deteriorated. More preferably, the soft magnetic film 130 has a thickness of about 2 nm or more and about 7 nm or less.

A magnetization rotation prevention film used as the antiferromagnetic film 180 which is in contact with the ferromagnetic film 190 can be formed of an irregular alloy such as, for example, Ir—Mn, Rh—Mn, Ru—Mn, or Cr—Pt—Mn. When the magnetization rotation prevention film is formed in a magnetic field, the magnetization rotation prevention film can be exchange-coupled with the ferromagnetic film 190, which simplifies the production process of the magneto-resistive effect memory cell 2000. Exemplary regular alloys usable for the magnetization rotation prevention film include Ni—Mn and Pt—(Pd)—Mn. These regular alloys need to be heat-treated for regularization but have a sufficient level of stability against heat. Among the regular alloys, Pt—Mn is especially preferable. Exemplary usable oxide materials include a-$Fe_2O_3$, NiO, or $LTO_3$ (L is a rare earth element excluding Ce, and T is Fe, Cr, Mn, or Co). When these materials having a relatively low level of conductivity are used, the conductive film 141 is preferably located so as to be in direct contact with the ferromagnetic film 190 as shown in FIG. 3.

The soft magnetic film 130 of the magneto-resistive effect memory cells 1000 and 2000 in the first and second examples corresponds to a free layer of a magneto-resistive effect element. Exemplary suitable materials for the soft magnetic film 130 include Co, Co—Fe, Ni—Fe, and Ni—Co—Fe alloys. Preferable Ni—Co—Fe alloys include $Ni_xCo_yFe_z$ ($0.6 \leq x \leq 0.9$, $0 \leq y \leq 0.4$, $0 \leq z \leq 0.3$), which is Ni-rich; and $Ni_{x'}Co_{y'}Fe_{z'}$ ($0 \leq x' \leq 0.4$, $0.2y' \leq 0.95$, $0z' \leq 0.5$), which is Co-rich.

The alloys having the above-mentioned compositions have a low magnetic distortion ($1 \times 10^{-5}$) which is required for sensors or MR heads.

EXAMPLE 3

Figure 5A:
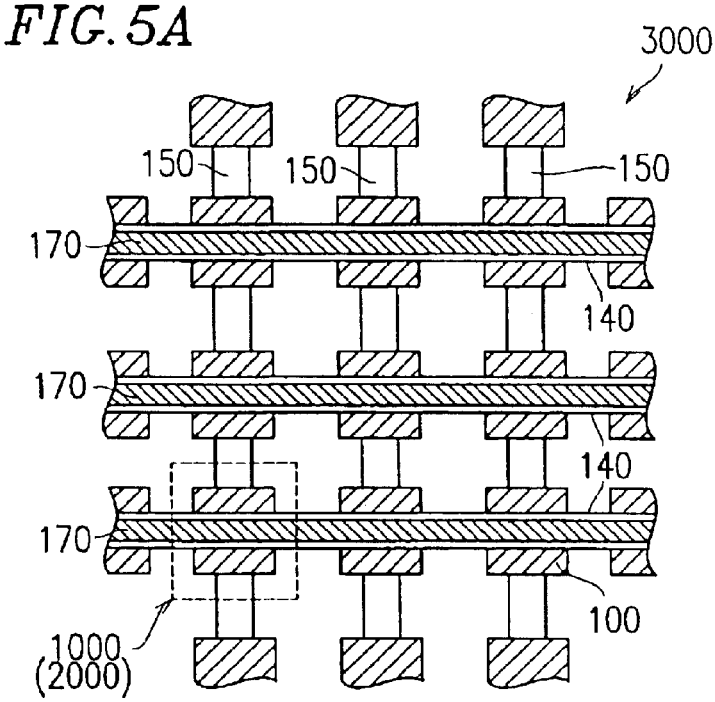
FIG. 5A is a plan view of an MRAM in an example according to the present invention.
Figure 5B:
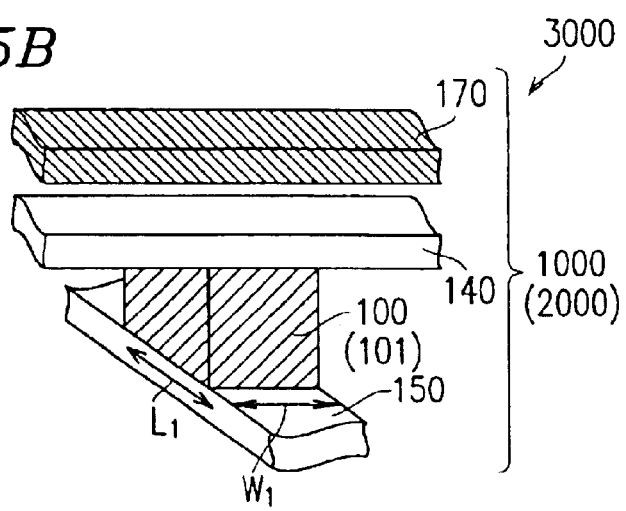
FIG. 5B is a partial isometric view of the MRAM in an example according to the present invention.
Figure 5C:
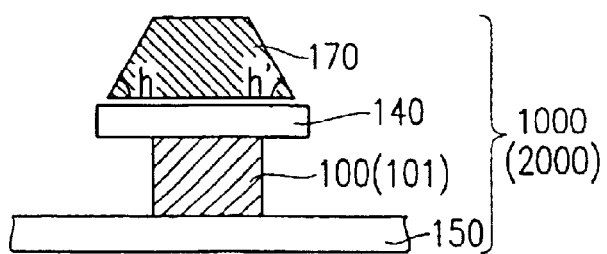
FIG. 5C is a partial cross-sectional view of the MRAM in an example according to the present invention.

FIGS. 5A, 5B and 5C show an MRAM 3000 in a third example according to the present invention. FIG. 5A is a partial plan view of the MRAM 3000, and FIG. 5B is a partial isometric view of the MRAM 3000. Identical elements previously discussed with respect to the magneto-resistive effect memory cells 1000 and 2000 described in the first and the second examples bear identical reference numerals and the detailed descriptions thereof will be omitted. Herein, the MR portion 100 (or 101) has a prism shape, but can have a circular cylinder, elliptical cylinder, truncated cone or truncated pyramid shape. A face of the MR portion 100 (or 101) which is in contact with the conductive films 140 or the like preferably has a relationship of $L_1 > W_1$ where $L_1$ represents the length and $W_1$ represent the width in order to provide an anisotropy in shape.

FIG. 5C is a cross-sectional view illustrating a preferable cross-sectional shape of the conductive film 170 which is more preferable for efficiently applying a magnetic field to the MR portion 100 (or 101). In FIG. 5C, letters h and h' each represent an angle made by a side of the cross-section facing the MR portion 100 (or 101) and another side. Preferably, at least one of angles h and h' is an acute angle.

Due to the cross-sectional shape of the conductive film 170 as shown in FIG. 5C, the current flowing in the conductive film 170 at a uniform density is caused to flow in the vicinity of the MR portion 100 (or 101) in a larger amount than in the rest of the conductive film 170. Thus, the magnetic field can be efficiently applied to the MR portion 100 (or 101). Such a cross-sectional shape is especially preferable when the aspect ratio (width/thickness) of the cross-section of the conductive film 170 is reduced due to the size reduction of the MRAM 3000.

As can be appreciated from the above, the free layer in the MR 100 (or 101) is preferably located as close as possible to the conductive film 170 in order to efficiently apply the magnetic field. Such an arrangement is preferable because it increases an operation margin for selecting an MR portion in the MRAM 3000 even when a synthesized magnetic field generated by the conductive film 170 (word line) and the sense line 150 (or 140) which are perpendicular to each other is used. This occurs because the level of the current required for causing a magnetization rotation is lowest at the operation point where the strength of the magnetic field generated by the conductive film 170 (word line) and the strength of the magnetic field generated by the sense line 150 are equal to each other.

The MRAM 3000 includes a plurality of magneto-resistive effect memory cells 1000 in the first example or a plurality of magneto-resistive effect memory cells 2000 in the second example which are arranged in a matrix. The magneto-resistive effect memory cells 1000 and 2000 are CPPMR elements.

As shown in FIGS. 5A and 5B, in the MRAM 3000 including the CPPMR elements, the magneto-resistive effect memory cells 1000 or 2000 are connected parallel to each other. Accordingly, even when the number N of the magneto-resistive effect memory cells increases, the S/N ratio is not substantially reduced.

Figure 6A:
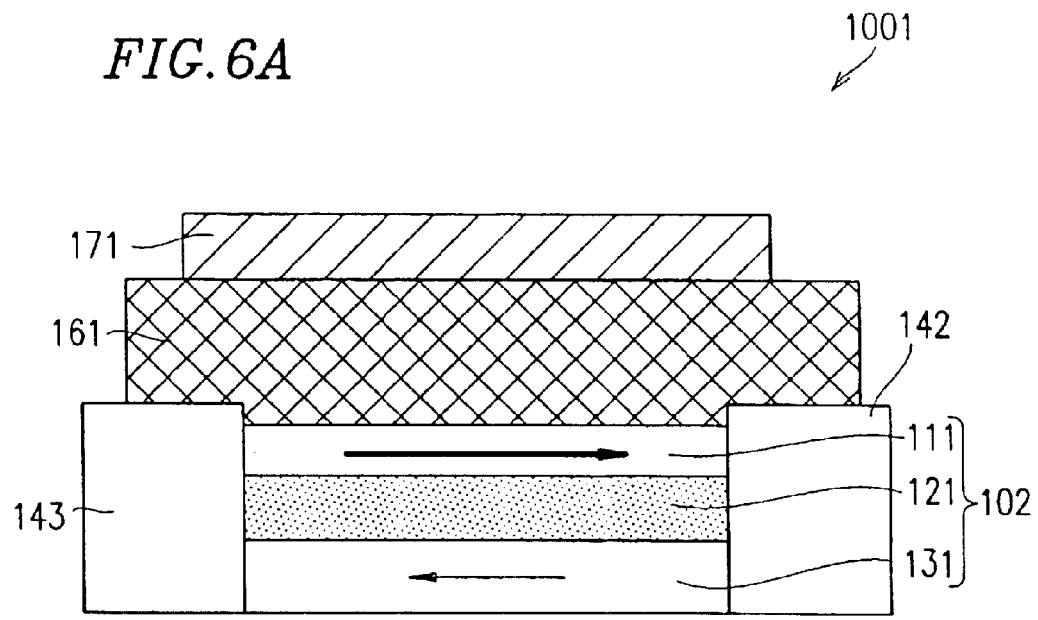
FIG. 6A is a cross-sectional view of a magneto-resistive effect memory cell in an example according to the present invention.

FIG. 6A is a cross-sectional view of a magneto-resistive effect memory cell 1001 according to the present invention.

The magneto-resistive effect memory cell 1001 includes an MR portion 102. The MR portion 102 includes a hard magnetic film 111, a nonmagnetic film 121, and a soft magnetic film 131. The MR portion 102 is electrically connected with conductive films 142 and 143. The conductive films 142 and 143 respectively act as a part of a sense line and a bit line, or vice versa. A conductive film 171 is provided above the MR portion 102 with an insulating film 161 interposed therebetween. The conductive film 171 acts as a part of a word line. The magneto-resistive effect memory cell 1001 having the above-described structure is a CIPMR element.

Figure 6B:
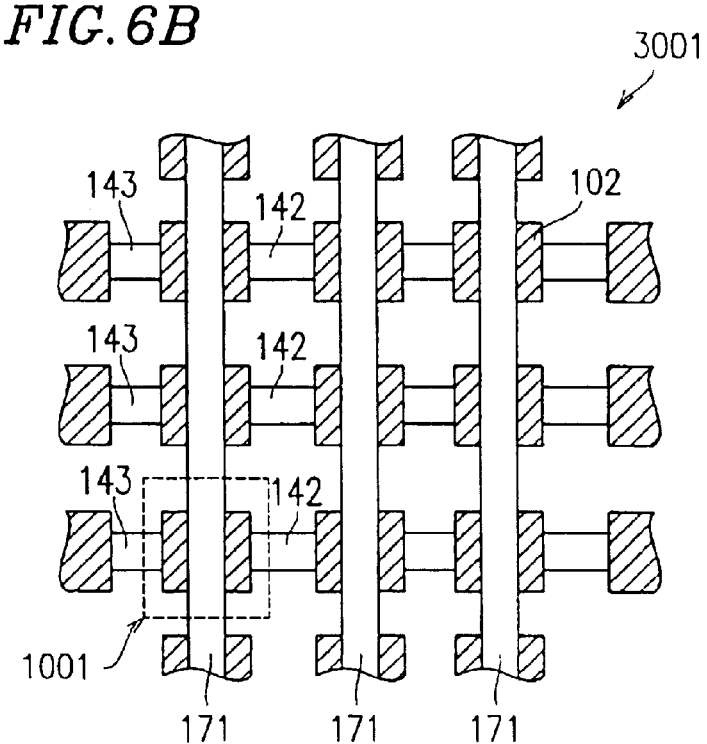
FIG. 6B is a partial isometric view of an MRAM in an example according to the present invention.

As shown in FIG. 6B, the MRAM 3001 includes the magneto-resistive effect memory cells 1001 connected in series. In such a case, when the number N of the magneto-resistive effect memory cells 1001 increases, the S/N ratio of the entirety of the MRAM 3001 is considered to be reduced although the MR ratio of each magneto-resistive effect memory cell 1001 remains the same.

In most of the figures in the present application, including FIGS. 5 and 6, the MR portion is represented as being larger than the sense, word and other lines. This is merely for clarity, and the size relationship between the MR portion and the lines is not limited to this. In order to efficiently apply a magnetic field to the MR portion, each line preferably covers the MR portions.

The MRAMs 3000 and 3001 are memory devices using a magnetic property, and thus are nonvolatile unlike semiconductor DRAMs utilizing accumulation of charges. Unlike semiconductor flash memory devices, there is no limit in the number of times of write/read operations in principle, and a time period required for write and erase operations is short to the order of nanoseconds.

The operation principle of each magneto-resistive effect memory cell is as described in the first and second examples. For producing the MRAM 3000 or 3001, a plurality of magneto-resistive effect memory cells 1000, 1001 or 2000 are provided in a matrix as shown in FIGS. 5A, 5B and 6B. Specifically, a plurality of word lines are first provided in a lattice, and then the magneto-resistive effect memory cells 1000, 1001 or 2000 are provided respectively adjacent to intersections of the word lines. In FIGS. 5A, 5B and 6B, the word lines (conductive film 170 or 171) are shown in only one direction (i.e., row direction or column direction) for simplicity and in conformity to FIGS. 1, 3 and 6A. The lattice arrangement of the word lines will be described in detail in the following examples.

A magnetic field generated by two intersecting word lines adjacent to a selected MR portion at address (N, M) is applied to the selected MR portion. One of the two word lines can be replaced with one sense line (or one bit line).

In an MRAM including a plurality of magneto-resistive effect memory cells 1000 shown in FIG. 1, when a synthesized magnetic field generated by the two word lines exceeds the value of a switching magnetic field represented by an asteroid-type curve of the hard magnetic film 110, information is written. When the above-mentioned synthesized magnetic field does not exceed the value of the switching magnetic field but exceeds the value of a switching magnetic field of the soft magnetic film, an NDRO of information is performed from a desired magneto-resistive effect memory cell.

In an MRAM including a plurality of magneto-resistive effect memory cells 2000 shown in FIG. 3, the operation is basically the same as that of the MRAM including magneto-resistive effect memory cells 1000 in that a synthesized magnetic field causes magnetization inversion of the soft magnetic film 130 for writing information. Information stored in these MRAMs can be read in the following manner. A pulse current is caused to flow in two word lines adjacent to an MR portion at address (N, M), and information stored in the MR portion is read based on a change in the resistance value which is monitored through the sense line and the bit line connected to the MR portion.

Figure 4C:
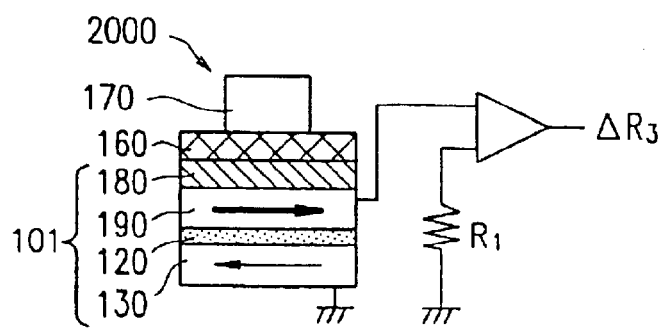

As described with reference to FIG. 4C in the second example, an NDRO of the information stored in the MR portion at address (N. M) is realized by comparing the resistance value of the MR portion and a reference resistance value.

Alternatively, each word line and each sense line can be provided with a switching device such as, for example, a transistor. An MR portion at address (N, M) can be selected by selecting the word line of row N and the sense line (or bit line) of column M by an address designating signal.

In order to prevent an inflow of a signal pulse through another path and a return of a harmonic component caused by an increase in speed of signal pulse transfer, and thus to transfer the signal pulse efficiently, each MR portion is preferably provided with an element or a semiconductor element having a rectifying function and nonlinear and asymmetric electric characteristics. Examples of the elements having nonlinear and asymmetric electric characteristics include a diode or a transistor. Especially in order to deal with a high speed pulse response, a MOS transistor is preferably used. Use of such an element improves the selectability of magneto-resistive effect memory cells arranged in a matrix.

Figure 7:
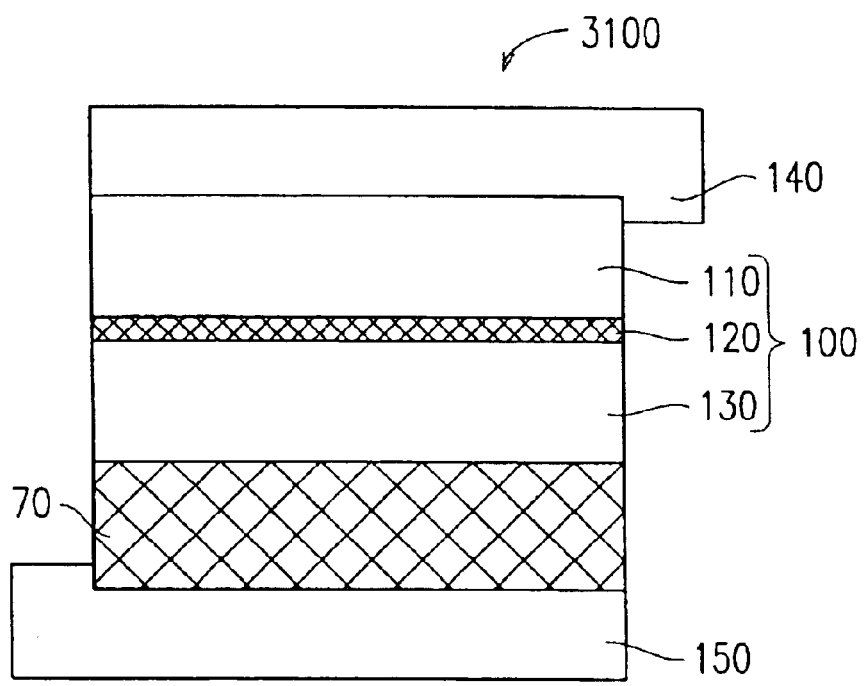
FIG. 7 is a cross-sectional views of a magneto-resistive effect memory cell in an example according to the present invention.

In this case, it is preferable to provide an element having a rectifying function and nonlinear and asymmetric electric characteristics (hereinafter, referred to as a "nonlinear element") 70 in series with the MR portion 100, such as in a magneto-resistive effect memory cell 3100 shown in FIG. 7. In FIG. 7, the nonlinear element 70 is provided below the MR portion 100. Alternatively, the nonlinear element 70 can be provided above the MR portion 100.

A preferable example of such a nonlinear element 70 has, for example, an M-I-S junction structure of metal (M)—insulator (I)—semiconductor (S), a P-N junction structure of a P-type semiconductor and an N-type semiconductor, or a P-I-N junction structure of p-type semiconductor—insulator (I)—N-type semiconductor.

It is generally known that the characteristics of an MR portion rely on the heat-treatment temperature and that some of the materials usable for an MR portion cannot provide the MR characteristics easily at a temperature of about 400° C. or higher. In the present invention, the nonlinear element 70, which is produced after the MR portion 100 is produced, is preferably formed of a material which is usable at a temperature of about 300° C. or lower such as, for example, a-Si (amorphous silicon).

As the density of a memory cell increases, the problem of the leakage magnetic field, which is generated by the word lines, to the outside of the selected MR portion becomes more serious. In order to reduce the interference effect of the leakage magnetic field to the outside of the selected MR portion, it is preferable to cause a current pulse to flow to, in addition to one set of word lines for generating a magnetic field at the address (N, M), one word line or one set of word lines which are adjacent to the above-mentioned first one set of word lines. Thus, the leakage magnetic field generated is counteracted so as to reduce the influence of the leakage magnetic field.

Figure 20A:
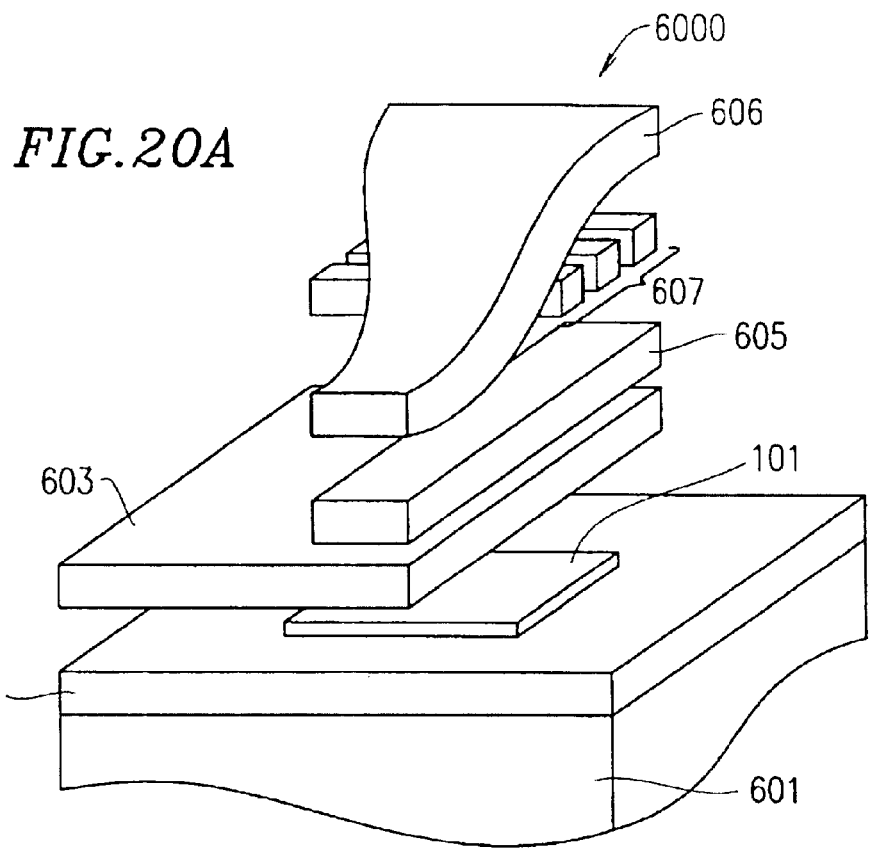
FIG. 20A is an isometric view of a magneto-resistive effect head in an example according to the present invention.
Figure 20B:
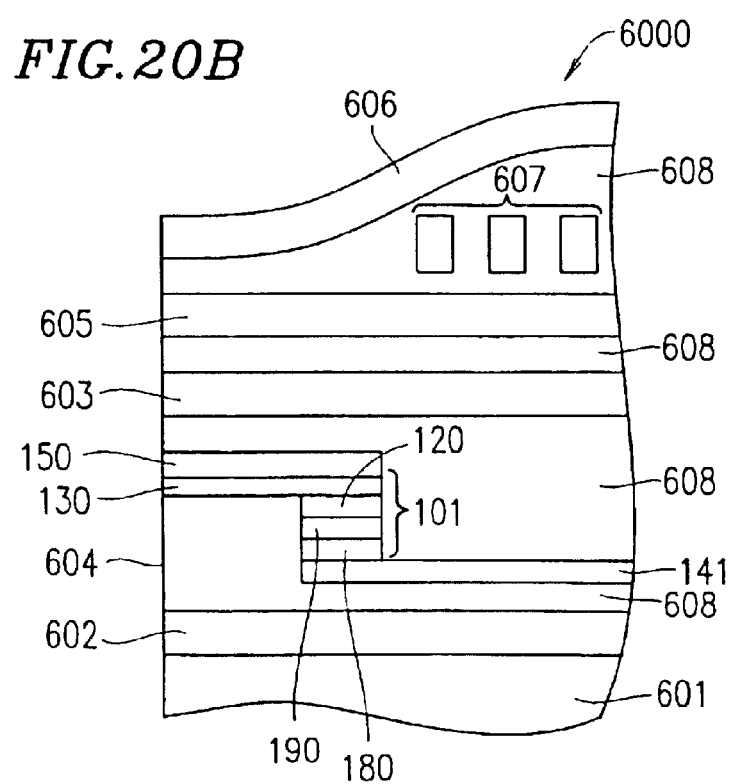
FIG. 20B is a cross-sectional view of the magneto-resistive effect head in an example according to the present invention.
Figure 21A:
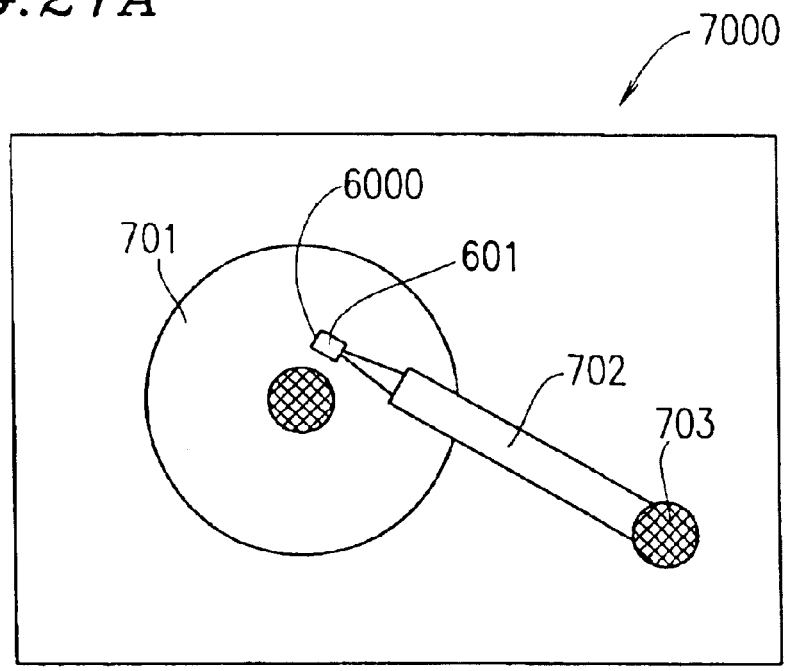
FIG. 21A is a plan view of a magnetic disk apparatus in an example according to the present invention.
Figure 21B:
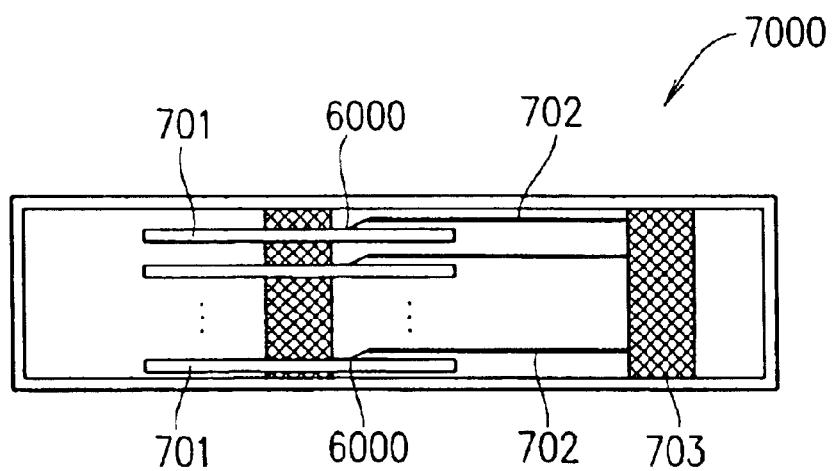
FIG. 21B is a cross-sectional view of the magnetic disk apparatus in an example according to the present invention.

A magneto-resistive effect head has a structure shown in FIGS. 20A and 20B. FIGS. 21A and 21B show a hard disk apparatus including the magneto-resistive effect head (which can include a recording head and a reproduction head). A portion interposed between magneto-resistive effect element shielding layers 602 and 603 (FIG. 20A) acts as a reproduction head, and recording magnetic poles 605 and 606 interposing a coil 607 therebetween act as a recording head. According to the present invention, a magneto-resistive effect head capable of high performance and high density recording can be provided by the improvement in the MR characteristics of the magneto-resistive effect element. The magneto-resistive effect head will be described in detail later in a fourteenth example according to the present invention.

EXAMPLE 4

FIGS. 8A through 8D are cross-sectional views of a magneto-resistive effect memory cell 4000 in a fourth example according to the present invention.

The magneto-resistive effect memory cell 4000 includes an MR portion 200. The MR portion 200 includes hard magnetic films 112, 113 and 114, soft magnetic films 132, 133 and 134, nonmagnetic insulating films 122, 123 and 124, and nonmagnetic films 222 and 223. A conductive film 172, which acts as a part of a word line, is provided above the MR portion 200 with an insulating film 162 interposed therebetween.

The MR portion 200 includes a plurality of soft magnetic film/nonmagnetic insulating film/hard magnetic film structures stacked with a nonmagnetic film interposed between each structure of the plurality. In the magneto-resistive effect memory cell 4000, three such structures are stacked. The number of such structures is optional.

Figure 8A:
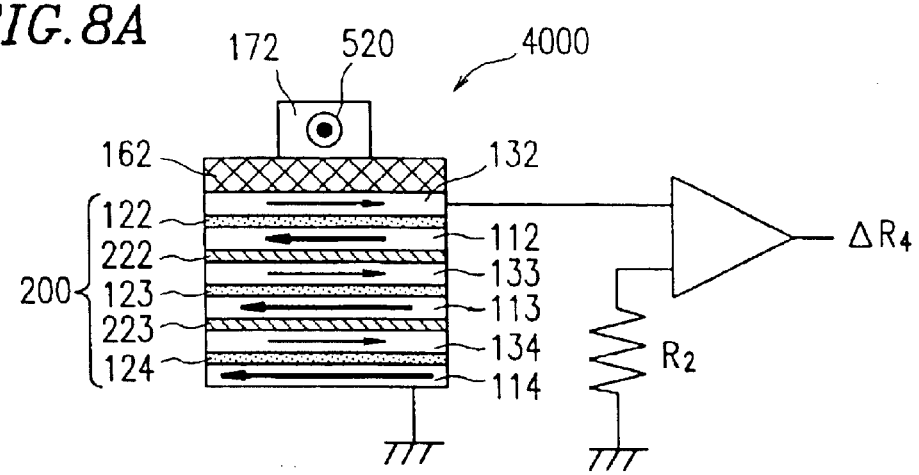
Figure 8B:
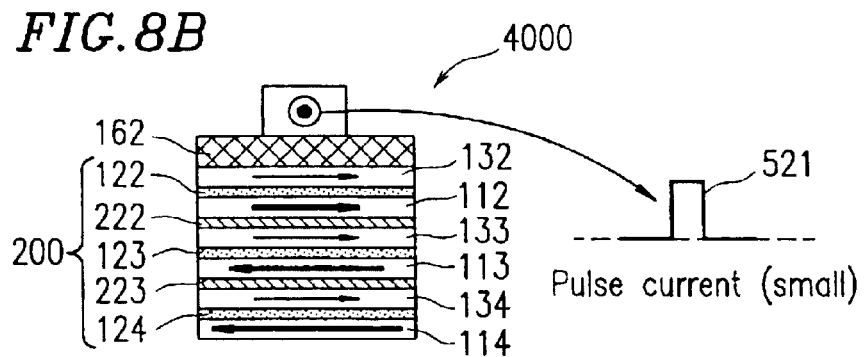
Figure 8C:
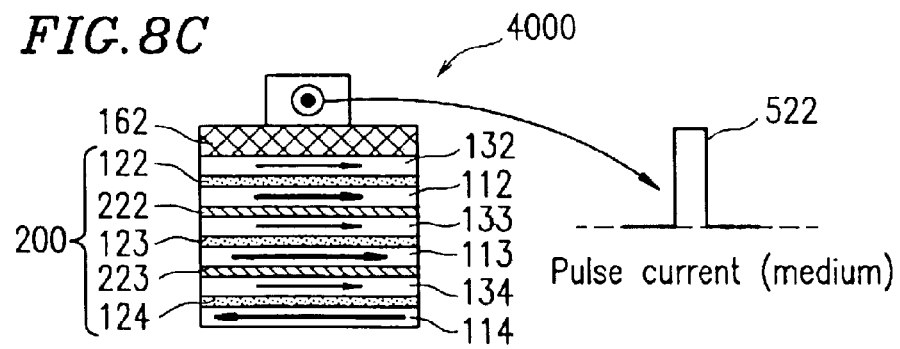
Figure 8D:
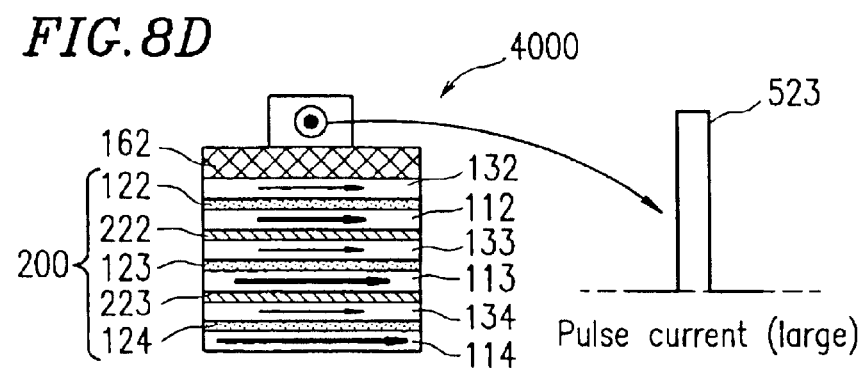

In the fourth example, the hard magnetic films 112, 113 and 114 have different magnetic coercive forces, and as a result, there are a plurality of magnetic field threshold values for writing. Accordingly, four different levels of a signal can be stored in one magneto-resistive effect memory cell 4000. The magnetic coercive force of each of the hard magnetic films 112, 113 and 114 can be changed by changing the composition or the thickness of the respective film. As shown in FIG. 8A, by a method of detecting a difference $\Delta R_4$ between the resistance value of the MR portion 200 and a reference resistance value $R_2$, the four levels of the signal stored (e.g., "0", "1", "2" and "3") can be read.

Since the magneto-resistive effect memory cell 4000 includes three soft magnetic film/nonmagnetic insulating film/hard magnetic film structures, there are four patterns of magnetization directions as shown in FIGS. 8A through 8D. Accordingly, four levels (e.g., "0", "1", "2" and "3") can be stored in one magneto-resistive effect memory cell 4000.

Information is written in the magneto-resistive effect memory cell 4000 by causing magnetization inversion of the hard magnetic films 112, 113 and 114 by a magnetic field which is generated by pulse currents 521, 522 and 523 flowing in the conductive film 172. In the fourth example, the magnetic coercive force of the hard magnetic film 112 is smallest and the magnetic coercive force of the hard magnetic film 114 is largest. By adjusting the level of the pulse current flowing in the conductive film 172, the hard magnetic film or films in which magnetization inversion is caused can be selected among the hard magnetic films 112, 113 and 114. One of the hard magnetic films 112, 113 and 114 in which magnetization inversion is to be caused can be selected by adjusting the level of the pulse current flowing in the conductive film 172. In the example shown in FIGS. 8A through 8D, the level of the pulse current gradually increases from the state in FIG. 8A toward the state in FIG. 8D. In FIG. 8A, the level of a pulse current 520 flowing in the conductive film 172 is still lower than the level of a pulse current 521 in FIG. 8B. In FIG. 8A, magnetization inversion occurs in none of the hard magnetic films; and in FIG. 5D, magnetization inversion occurs in all of the hard magnetic films.

Information is read from the magneto-resistive effect memory cell 4000 by a method of detecting the difference $\Delta R_4$ between the resistance value of the MR portion 200 and the reference resistance value $R_2$ as described above.

Information can also be read by supplying a current to the conductive film 172 and reading a change in the resistance value of the MR portion 200. In this case, the change in the resistance value of the MR portion 200 can be detected by a comparison with the reference resistance value $R_2$.

The soft magnetic films 132, 133 and 134 can have different magnetic coercive forces. In such a case, many levels of the signal can be stored in one magneto-resistive effect memory cell 4000 by precisely adjusting the level of the pulse current flowing in the conductive film 172 and determining the film or films in which magnetization inversion is to be caused and the film or films in which magnetization inversion is not to be caused among the soft magnetic films 132, 133 and 134. These levels of the signal are preferably read by a method of detecting the difference $\Delta R_4$ between the resistance value of the MR portion 200 and the reference resistance value $R_2$ as described above.

Alternatively, the magnetization direction of all the hard magnetic films can be pinned, in which case the levels of the signal can be stored by causing the magnetization inversion only in an arbitrary one of the soft magnetic films as described in the second example.

EXAMPLE 5

In a fifth example according to the present invention, a method for producing the magneto-resistive effect memory cell 1000 shown in the first example will be described.

Referring to FIG. 1, the MR portion 100 of a sandwich type was produced using, as sputtering targets, $Ni_{0.68}Co_{0.2}Fe_{0.12}$ (for the soft magnetic film 130), Al (for the nonmagnetic insulating film 120), and $Co_{0.75}Pt_{0.25}$ (for the hard magnetic film 110)(the compositions are all by the atomic ratio). For sputtering, a multi-origin sputtering apparatus (not shown) was used. The basic structure of the MR portion 100 was CoNiFe (15)/AlN(1)/CoPt (10). (In such a representation of the structure, the numeral in the parentheses represents the thickness (unit: nm), and "/" represents that the substances mentioned before and after the "/" are combined.) The thickness of each film or layer was controlled by a shutter.

AlN which is a nitride NM used for the nonmagnetic insulating film 120 was formed by sputtering Al in an ($N_2$+(Ar)) atmosphere.

CoPt for the hard magnetic film 110 was magnetized, and the MR characteristics of the MR portion 100 were measured at room temperature at an applied magnetic field of 100 Oe. The MR ratio was about 26%. The magnetic field width generated by the MR portion 100 which is represented by Hc was about 5 Oe to 100 Oe. The tunnel junction area was about 1 $\mu m^2$. The impedance of the tunnel junction was about 25Ω. It was also found that the impedance of the tunnel junction can be controlled in the range of several ohms to several hundred ohms by changing the film formation conditions. The magneto-resistive effect memory cell 1000 shown in FIG. 1 was produced including the MR portion 100 produced by the above-mentioned method. The conductive films 140 and 150 acting as a part of either a sense line or a bit line were formed of Pt or Au, and the conductive film 170 acting as a part of a word line was formed of Al, AuCr, Ti/Au or Cu/Ta. The insulating film for insulating the MR portion 100 and the conductive film 170 was formed of $CaF_2$, $SiO_2$ or $Si_3N_4$.

The operation of the magneto-resistive effect memory cell 1000 produced in this manner was confirmed in the following manner.

Figure 9A:
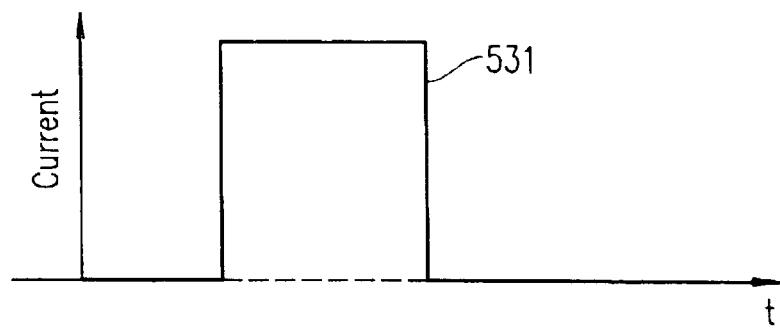
FIGS. 9A and 9B show an operation of a magneto-resistive effect memory cell in an example according to the present invention.
Figure 9B:
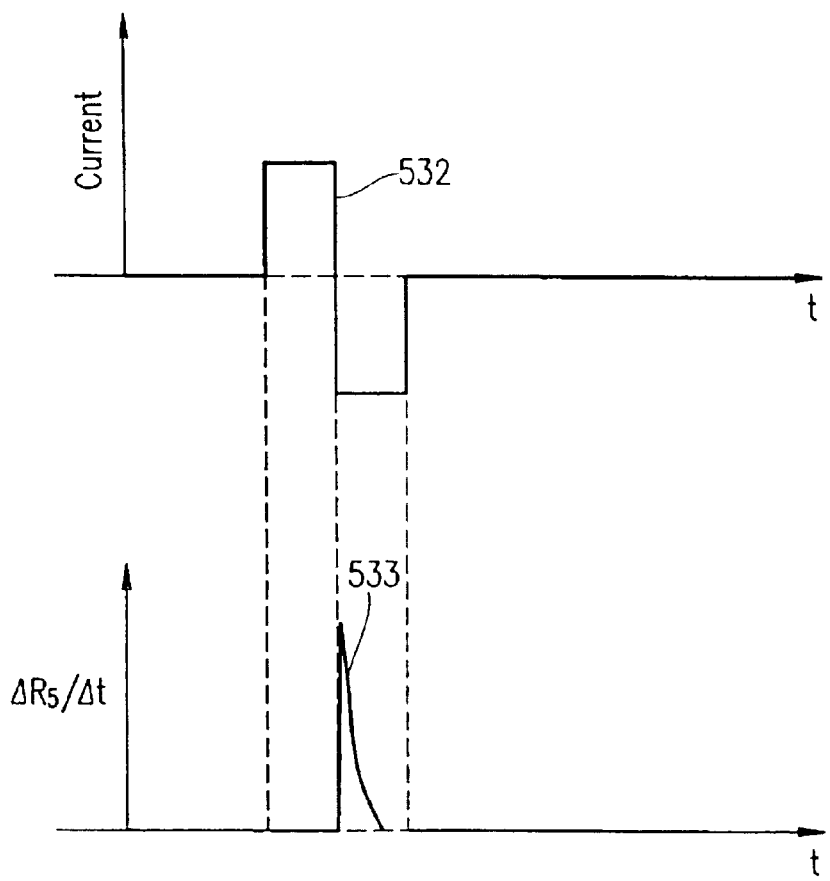

A pulse current 531 shown in FIG. 9A was caused to flow in the conductive film 170 (word line) to magnetize the hard magnetic film 110 in one direction. Then, a pulse current 532 (upper portion in FIG. 9B) was caused to flow in the conductive film 170, and a change in the voltage value (i.e., a change in the resistance value $\Delta R_5/\Delta t$)of the magneto-resistive effect memory cell 1000 measured through the conductive films 140 and 150 (sense line and bit line) was monitored. As a result, a pulse 533 (lower portion in FIG. 9B) corresponding to the written information was detected. Thus, it was found that the desired magneto-resistive effect memory cell 1000 was realized.

EXAMPLE 6

In a sixth example according to the present invention, a method for producing the magneto-resistive effect memory cell 2000 shown in the second example will be described.

The magneto-resistive effect memory cell 2000 shown in FIG. 3 was produced by a method similar to that of the fifth example.

The MR portion 101 having a basic structure of $Ni_{0.1}Fe_{2.9}O_4$ (15)/AlN (1.2)/$Ni_{0.2}Fe_{2.8}O_4$ (5)/IrMn (25) was produced using, as sputtering targets, $Ni_{0.1}Fe_{2.94}$ (for the soft magnetic film 130), Al (for the nonmagnetic insulating film 120), $Ni_{0.2}Fe_{2.8})O_4$ (for the ferromagnetic film 190), and IrMn (for the magnetization rotation prevention layer as the antiferromagnetic film 180). AlN was formed by the method described in the fifth example.

The MR characteristics of the MR portion 101 were measured at room temperature at an applied magnetic field of 100 Oe. The MR ratio was about 24%. The tunnel junction area was about 1 $\mu m^2$.

The conductive films 141 and 150 were formed of Au, and the conductive film 170 was formed of AuCr. The insulating film for insulating the MR portion 101 and the conductive layer 170 was formed of $SiO_2$. The insulating film can be formed of $CaF_2$, $Al_2O_3$ or $Si_3N_4$.

The operation of the magneto-resistive effect memory cell 2000 produced in this manner was confirmed in the following manner.

Figure 10A:
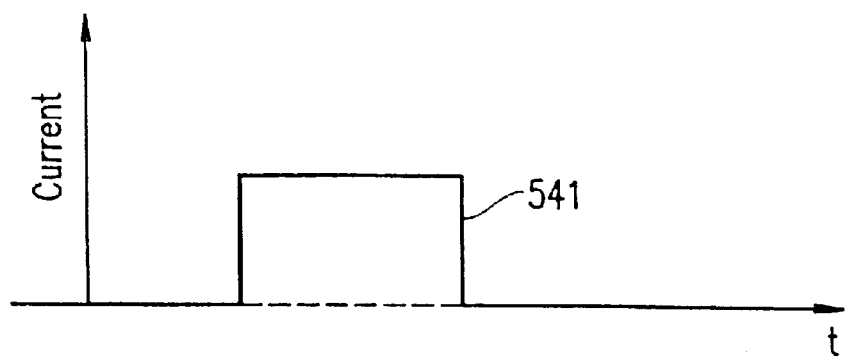
FIG. 10A and 10B show an operation of a magneto-resistive effect memory cell in an example according to the present invention.
Figure 10B:
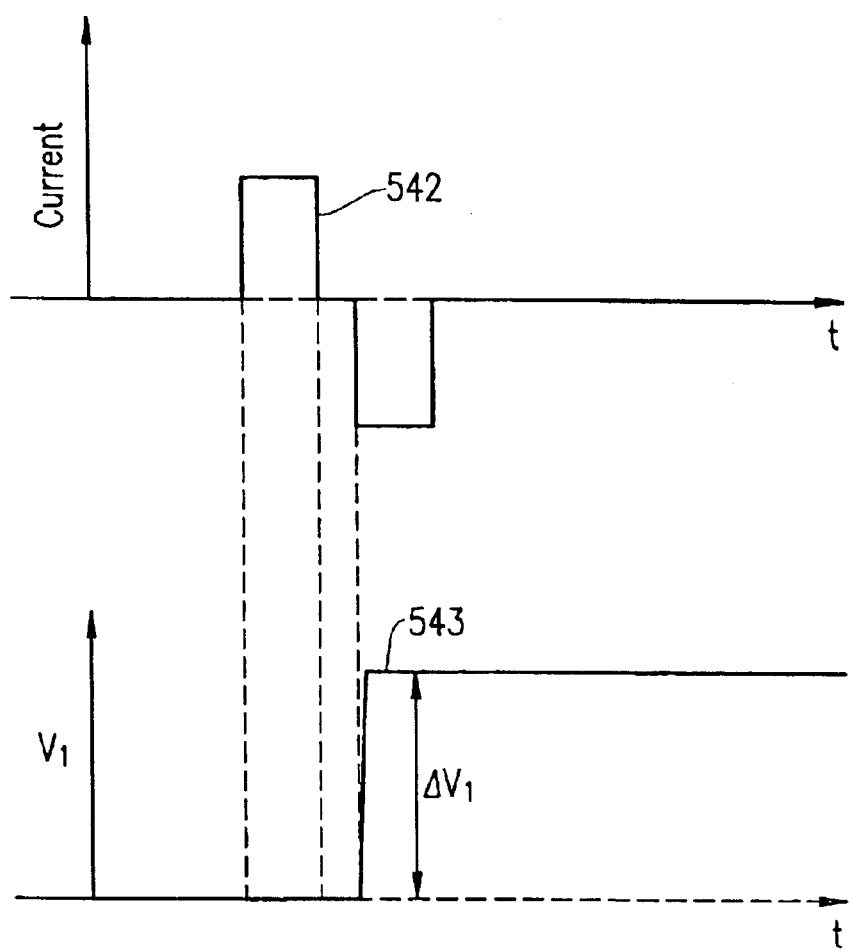

A pulse current 541 shown in FIG. 10A was caused flow in the conductive film 170 to magnetize the soft magnetic film 130 in one direction. Then, a pulse current 542 (upper portion in FIG. 10B) was caused to flow in the conductive film 170, and a change in the voltage value ($\Delta V_1$) of the magneto-resistive effect memory cell 2000 measured through the conductive films 141 and 150 was monitored. As a result, a voltage change 543 (lower portion in FIG. 10B) corresponding to the written information was detected. Thus, it was found that the desired magneto-resistive effect memory cell 2000 was realized.

EXAMPLE 7

In a seventh example according to the present invention, a method for producing the magneto-resistive effect memory cell 2000 shown in the second example will be described.

The magneto-resistive effect memory cell 2000 shown in FIG. 3 was produced by a method similar to that of the sixth example.

The MR portion 101 having a basic structure of $Ni_{0.8}Fe_{0.2}$ (10)/AlN (d)/$Co_{0.75}Fe_{0.25}$ (5)/IrMn (20) was produced using, as sputtering targets, $Ni_{0.8}Fe_{0.2}$ (for the soft magnetic film 130), Al (for the nonmagnetic insulating film 120), $Co_{0.75}Fe_{0.25}$ (for the ferromagnetic film 190), and IrMn (for the magnetization rotation prevention layer as the antiferromagnetic film 180). AlN was formed by the method described in the fifth example.

Figure 11:
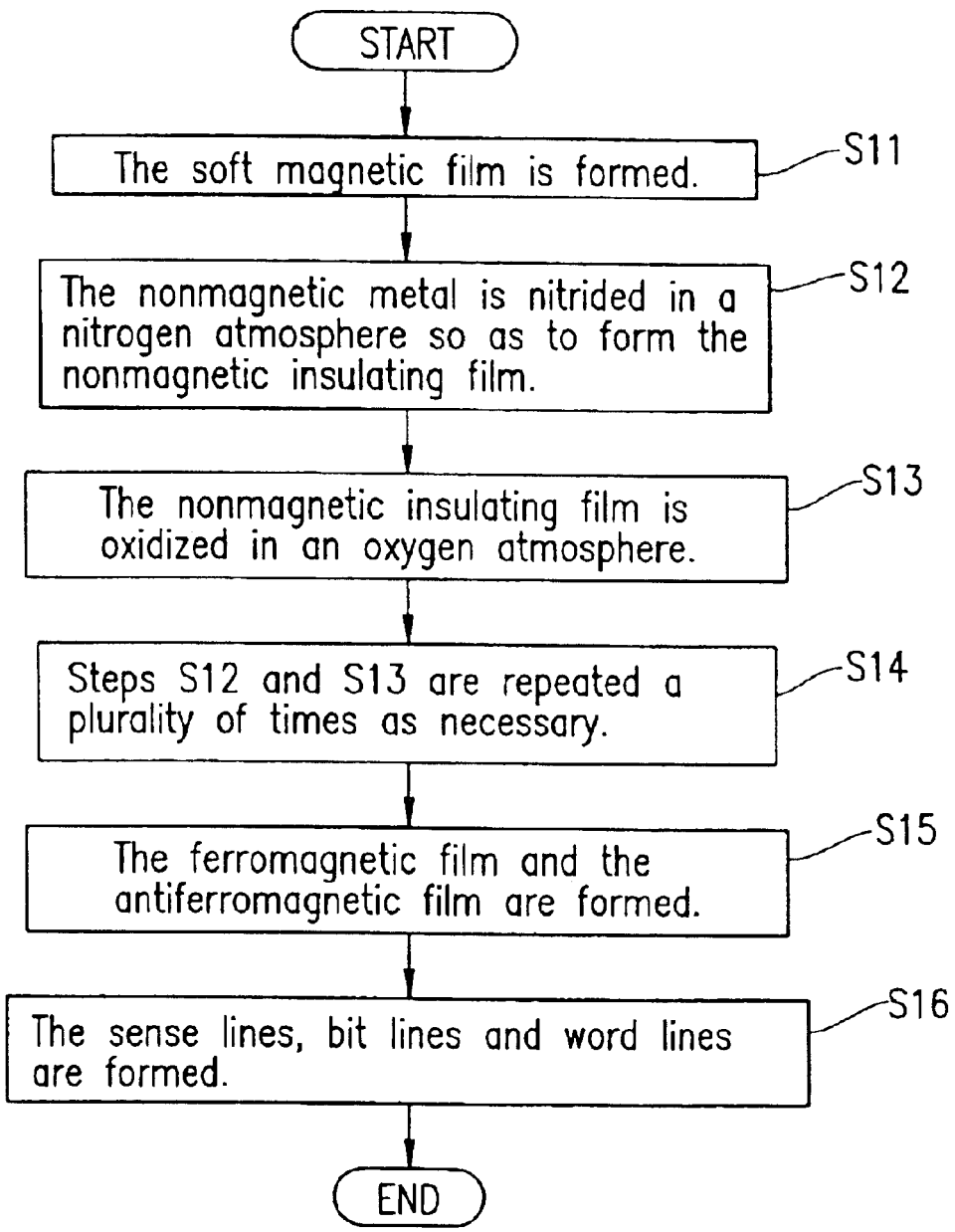
FIG. 11 is a flowchart illustrating a method for producing a magneto-resistive effect memory cell in an example according to the present invention.

FIG. 11 is a flowchart illustrating a method for producing the magneto-resistive effect memory cell 2000 in this example. In this example, the magneto-resistive effect memory cell 2000 was produced as follows. The soft magnetic film 130 was formed (S11), and a nonmagnetic metal material was nitrided in a nitrogen atmosphere to form the nonmagnetic insulating film 120 (S12). Then, the nonmagnetic insulating film 120 was oxidized in an oxygen atmosphere (S13). These nitriding step and the oxidizing step were repeated a plurality of times as necessary (S14). The ferromagnetic film 190 and the antiferromagnetic film 180 were formed (S15), and the sense lines and the bit lines (conductive films 141 and 150) and the word lines (conductive film 170) were formed (S16). The order in which these elements are formed are arbitrarily varied in accordance with examples. For example, the ferromagnetic film 190 and the antiferromagnetic film 180 can be formed before the soft magneticfilm 130 is formed. The sense lines or the bit lines (conductive film 141 or 150) can be formed before the soft magnetic film 130 is formed.

Figure 12A:
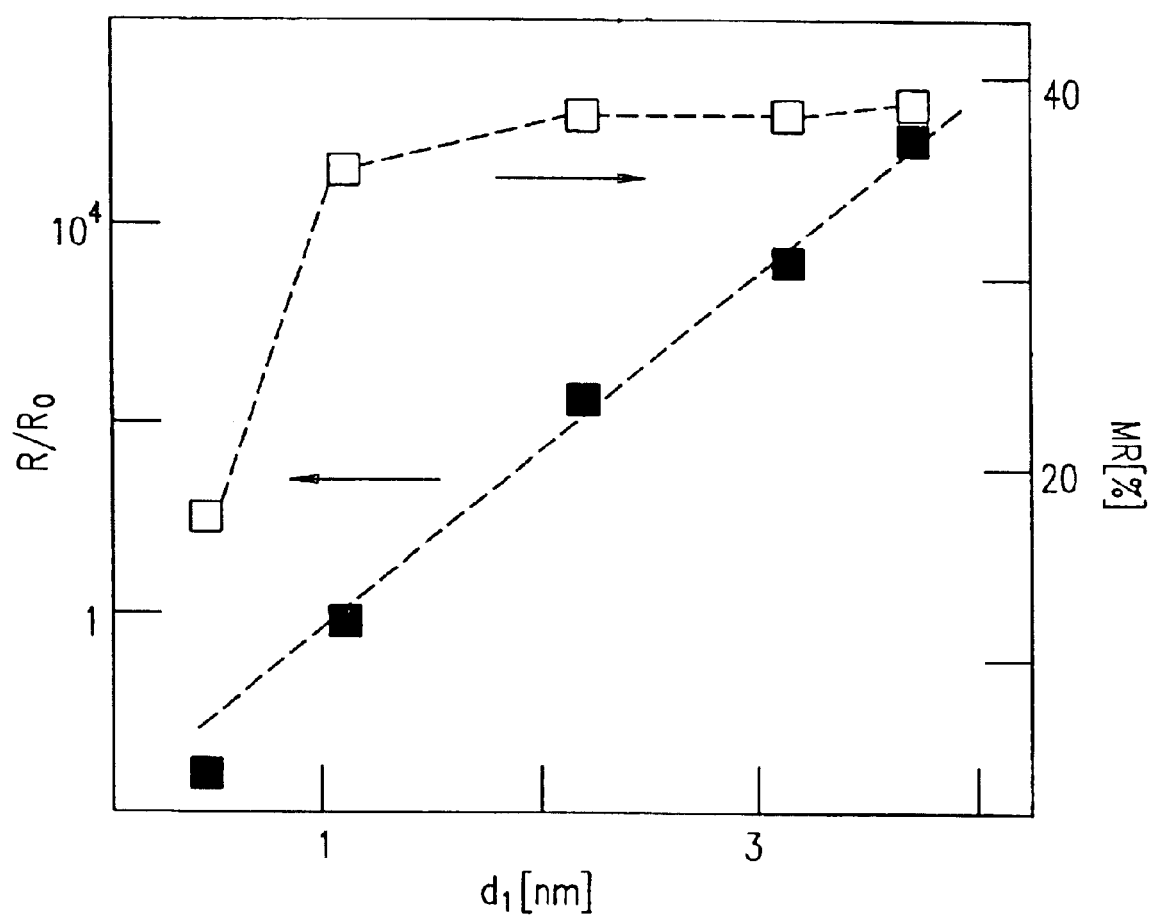
FIGS. 12A and 12B are graphs illustrating characteristics of an MR portion in an example according to the present invention.
Figure 12B:
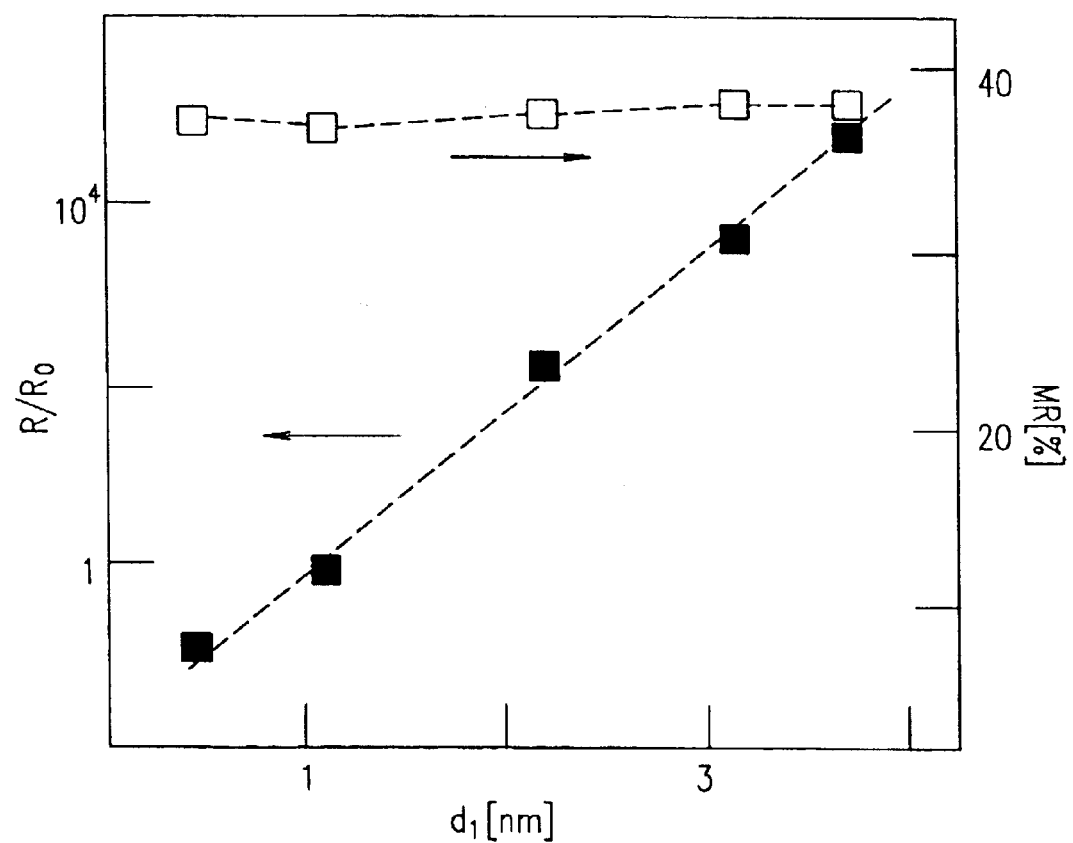

The MR characteristics of the MR portion 101 produced were measured at room temperature at an applied magnetic field of 100 Oe. The MR portion 101 exhibited the behavior shown in FIG. 12A. In FIGS. 12A and 12B, $R_0$ indicates the standardized interface resistance ($\Omega \mu m^2$) when the nonmagnetic insulating film 120 has a thickness $d_1$ of 1.2 nm. ■ indicates the specific resistance ($R/R_0$) of the nonmagnetic insulating film 120, and □ indicates the MR ratio (%).

From FIG. 12A, it was appreciated that the nonmagnetic insulating film 120 can be produced with satisfactory controllability so as to realize a desired magneto-resistive effect memory cell 2000 according to this example. When the nonmagnetic insulating film 120 is excessively thin, the nonmagnetic insulating film 120 has a specific resistance which is considered to indicate an appearance of a leak conductance path. As a result of subjecting the nonmagnetic insulating film 120 (i.e., nitride film) produced by the method shown in the fifth example to heat treatment performed in an oxygen atmosphere (S13), the characteristics of the nonmagnetic insulating film 120 are changed as shown in FIG. 12B. In this manner, the nonmagnetic insulating film 120 having desired characteristics was produced. It was found that when the nonmagnetic insulating film 120 is set to have a thickness d exceeding 1 nm, the reproducibility and uniformity of the characteristics of the nonmagnetic insulating film 120 are improved by repeating the AlN film formation step and the subsequent oxidizing step alternately a plurality of times (S14). Accordingly, using the method for producing the nonmagnetic insulating film 120 in this example, a tunnel junction using a nitride nonmagnetic film having satisfactory characteristics can easily be provided.

Such a method for producing a nitride nonmagnetic insulating film is applicable to any semiconductor having an insulating film as well as an insulating film of an MR portion.

Figure 13A:
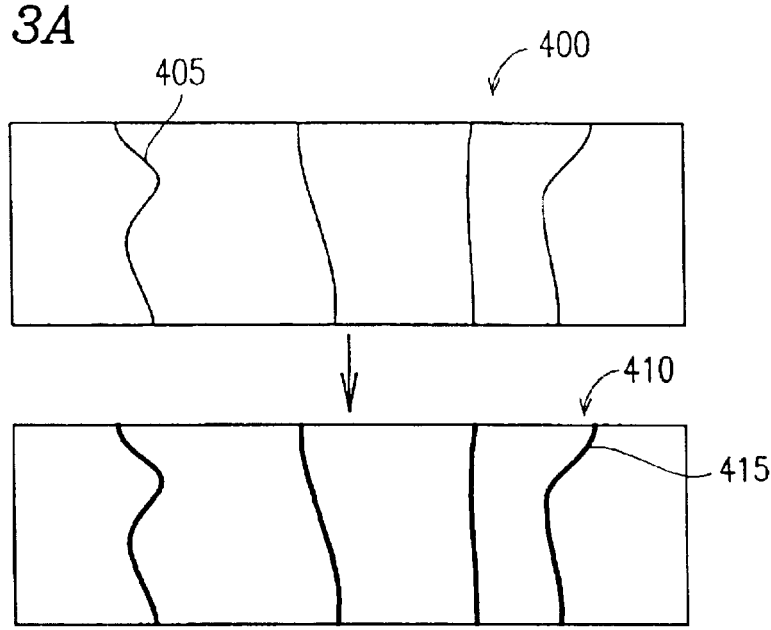
FIGS. 13A and 13B are cross-sectional views of a nitride film in an example according to the present invention.

The reason is that a nitride film 410 (FIG. 13A) in its entirety can have its insulating characteristics improved by oxidizing incompletely insulating portions 405, which are included in a nitride film 400 and tend to appear mainly in a grain boundary, so that the incompletely insulating portions 405 become oxidized portions 415.

Figure 13B:
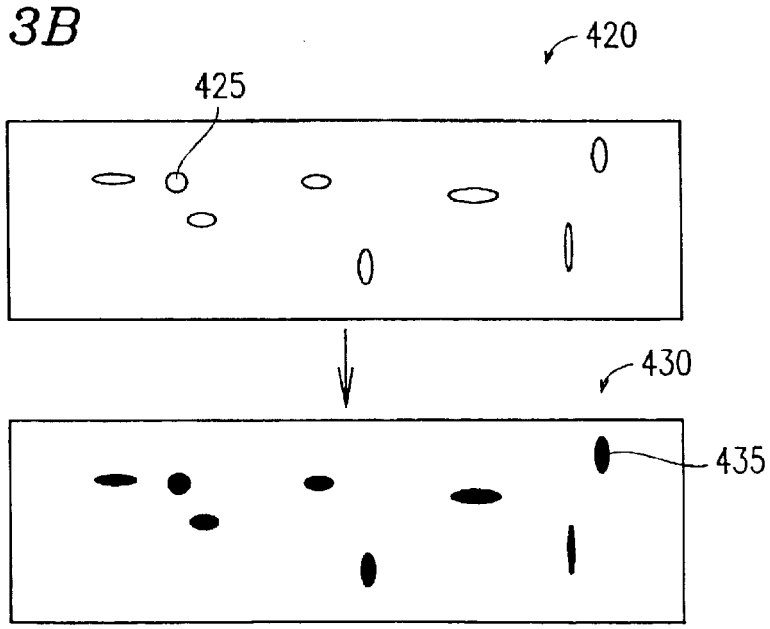

In the case where incompletely nitrided portions 425 (FIG. 13B) are included in a nitride film 420 in a dispersed manner, a leak path for conducting a current via the incompletely nitrided portions 425 in a hopping manner appears. In this case, a nitride film 430 in its entirety can have its insulating characteristics improved by oxidizing the incompletely nitrided portions 425 into oxidized portions 435.

As a result, the oxidized portions 415 produced in the nitride film 410 and oxidized portions 435 produced in the nitride film 430 exhibit satisfactory insulating characteristics, and the nitride occupying most of the nitride films 410 and 430 governs the tunnel junction resistance characteristics. Therefore, a desired MR element can be provided. The nonmagnetic insulating film produced in this example is formed of an Al—N—(O) structure, where N is a nitrogen element and (O) is an oxygen element contained in the nitride film. Al can be replaced with a conductive metal material such as, for example, B or In.

EXAMPLE 8

In an eighth example according to the present invention, a method for producing the magneto-resistive effect memory cell 2000 shown in the second example will be described.

The magneto-resistive effect memory cell 2000 shown in FIG. 3 was produced by a method similar to that of the sixth example.

The MR portion 101 having a basic structure of $Ni_{0.8}Fe_{0.2}$ (10)/(Al—N (d)/Al—O (D))n/$Co_{0.75}Fe_{0.25}$ (5)/PtMn (20) was produced using, as sputtering targets, $Ni_{0.8}Fe_{0.2}$ (for the soft magnetic film 130), Al (for the nonmagnetic insulating film 120), $Co_{0.75}Fe_{0.25}$ (for the ferromagnetic film 190), and PtMn (for the magnetization rotation prevention layer as the antiferromagnetic film 180). Here, d indicates the thickness of a nitride film, D indicates the thickness of an oxide film, and n indicates the number of times the nitride film and the oxide film are stacked.

Figure 14:
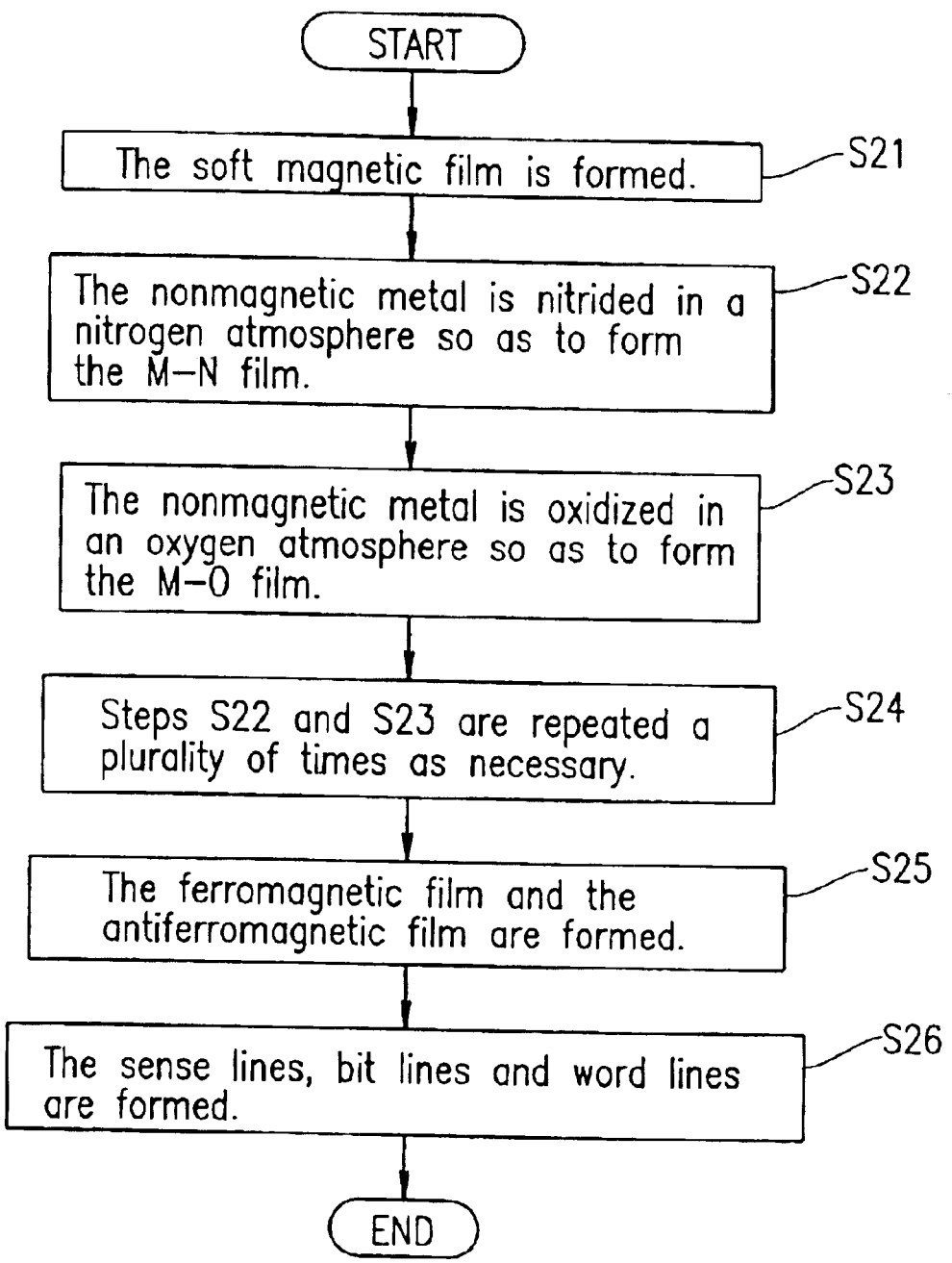
FIG. 14 is a flowchart illustrating a method for producing a magneto-resistive effect memory cell in an example according to the present invention.

FIG. 14 is a flowchart illustrating a method for producing the magneto-resistive effect memory cell 2000 in this example. In this example, the MR portion 101 having the above-described structure was produced in order to further improve the controllability of the tunnel junction resistance characteristics. The soft magnetic film 130 was formed (S21). The nonmagnetic insulating film 120 was formed by first producing a nitride film 441 shown in FIG. 15A by the method shown in the fifth example (S22) and then producing an Al—O film as an oxide film 442 on the nitride film 441 (S23). The oxide film 442 was produced by forming an Al film by sputtering and subjecting the Al film to spontaneous oxidization in a vacuum tank. This technique was best. Alternatively, the oxide film 442 can be produced by plasma oxidation of an Al metal material or by directly stacking $Al_2O_3$.

In this example, when the nonmagnetic insulating film 120 was set to have a thickness of 1 nm or greater, the nonmagnetic insulating film 120 was produced by stacking the nitride film 441 and the oxide film 442 a plurality of times (i.e., n=2 or more) (S24). The value of d was set to be 0.3 to 1 nm, and the value of D was set to be 0.2 to 0.5.

Then, the ferromagnetic film 190 and the antiferromagnetic film 180 were formed (S25), and the sense lines and the bit lines (conductive films 141 and 150) and the word lines (conductive film 170) were formed (S26). The order in which these elements are formed are arbitrarily varied in accordance with examples. For example, the ferromagnetic film 190 and the antiferromagnetic film 180 can be formed before the soft magnetic film 130 is formed. The bit lines or the sense lines (conductive film 141 or 150) can be formed before the soft magnetic film 130 is formed. The oxide film 442 can be formed before the nitride film 441 is formed.

Figure 15A:
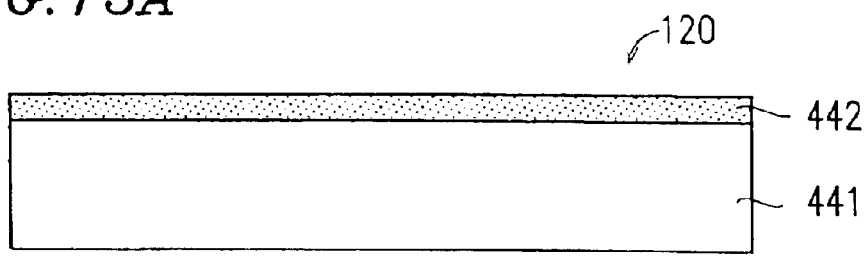
FIGS. 15A, 15B and 15C are cross-sectional views of a metal insulating film in an example according to the present invention.
Figure 15B:
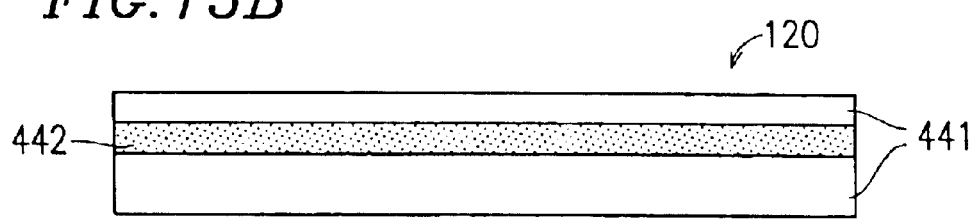
Figure 15C:
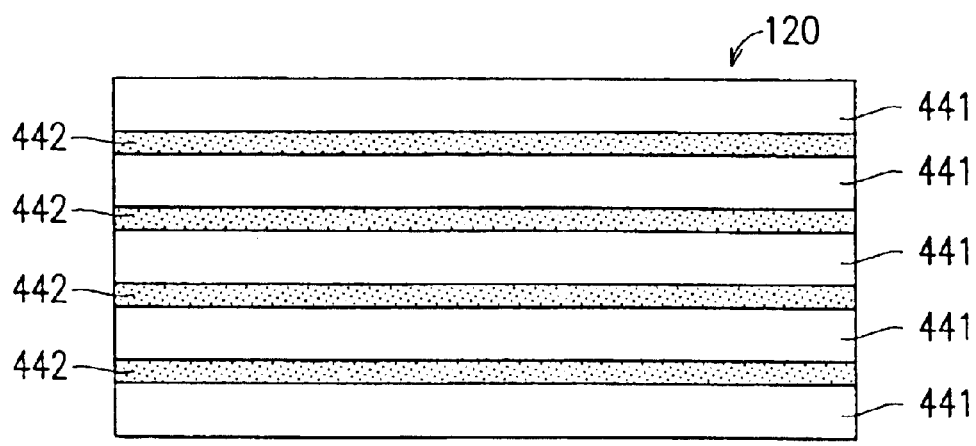

In FIG. 15A, a top surface and a bottom surface of the nonmagnetic insulating film 120 are formed of the oxide film 442 and the nitride film 441. With reference to FIG. 3, when one of the soft magnetic film 130 and the ferromagnetic film 190 interposing the nonmagnetic insulating film 120 is formed of a nitride, it is preferable to provide the nitride film 441 on the soft magnetic film 130 or the ferromagnetic film 190 which is formed of nitride. In this way, a cleaner junction interface is obtained. When the soft magnetic film 130 and the ferromagnetic film 190 interposing the nonmagnetic insulating film 120 are both formed of a nitride, the nonmagnetic insulating film 120 is preferably formed to have the structure shown in FIG. 15B. In the case where the nonmagnetic insulating film 120 is formed by stacking the nitride film 441 and the oxide film 442 a plurality of times as shown in FIG. 15C, the type of film at both surfaces of the nonmagnetic insulating film 120 is preferably selected in accordance with the type of each of the soft magnetic film 130 and the ferromagnetic film 190 interposing the nonmagnetic insulating film 120.

EXAMPLE 9

In a ninth example according to the present invention, a method for producing a magneto-resistive effect memory cell 3101 based on the magneto-resistive effect memory cell 3100 shown in the third example will be described.

With reference to FIG. 7, a nonlinear element 70 formed of a thin film having a P-I-N junction was formed on a substrate. The thin film having a P-I-N junction was produced at a temperature of about 180° C. to about 260° C. (typically, about 220° C.). The P layer, the I layer, and the N layer were produced to have thicknesses of 30 to 50 nm, 300 to 400 nm and 30 to 50 nm, respectively. The laminate was processed into individual elements. The MR portion 100 was formed on the resultant nonlinear element 70 by a method similar to that of the fifth example. Thus, the magneto-resistive effect memory cell 3100 shown in FIG. 7 was produced.

The MR portion 100 having a basic structure of $Ni_{0.1}Fe_{2.9}O_4$ (15)/AlN (1.2)/$Fe_{16}N_2$ (10) was produced using, as sputtering targets, $Ni_{0.1}Fe_{2.9}O_4$ (for the soft magnetic film 130), Al (for the nonmagnetic insulating film 120), and $Fe_{16}N_2$ (for the ferromagnetic film 110). AlN was formed by the method described in the fifth example.

The interface between the AlN film and the $Fe_{16}N_2$ film was observed to be very flat and satisfactory. This reflects a satisfactory junction compatibility of AlN and $Fe_{16}N_2$, which are both nitrides.

Figure 16A:
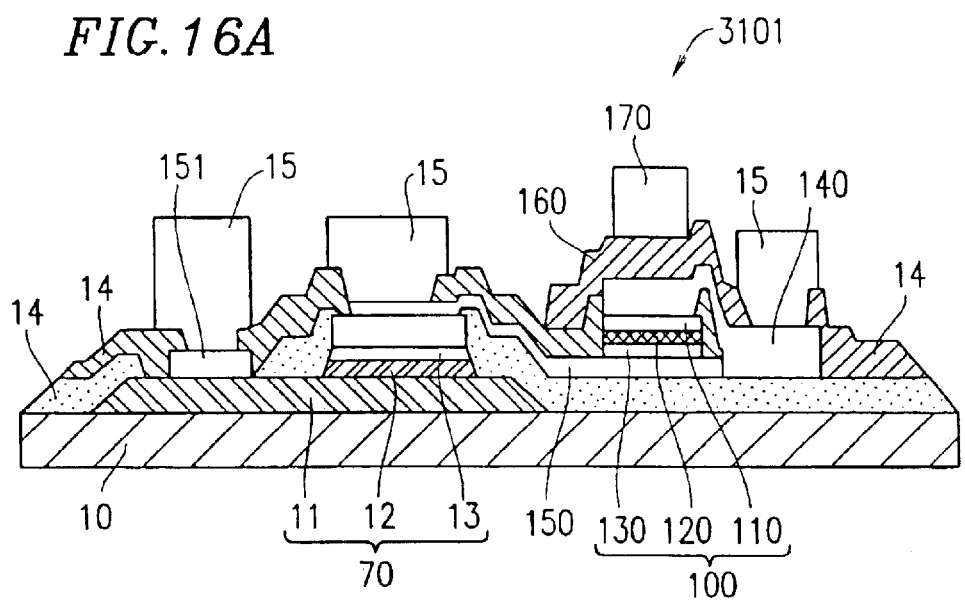
FIGS. 16A and 16B are cross-sectional views of a metal insulating film in an example according to the present invention.

Based on the magneto-resistive effect memory cell 3100, the magneto-resistive effect memory cell 3101 shown in FIG. 16A was produced.

The magneto-resistive effect memory cell 3101 shown in FIG. 16A has the following structure. On a substrate 10, the MR portion 100 and the nonlinear element 70 are formed. The nonlinear element 70 includes a P layer 11, an I layer 12 and an N layer 13. The magneto-resistive effect memory cell 3101 further includes conductive films 140, 150 and 151 and a contact layer 15 for electrically connecting the MR portion 100 and the nonlinear element 70 and also connecting these elements and an external device. The magneto-resistive effect memory cell 3101 also includes an insulating layer 14.

The MR characteristics of the magneto-resistive effect memory cell 3101 shown in FIG. 16A were measured at room temperature at an applied magnetic field of 100 Oe. The MR ratio was about 28%, the tunnel junction area was about 1 $\mu m^2$, and the tunnel junction impedance was about 20 Ω.

The conductive films 140, 150 and 151 were formed of Au, and the conductive film 170 was formed of AuCr. The insulating film for insulating the MR portion 100 and the conductive layer 170 was formed of an $SiO_2$ or $Si_3N_4$ film obtained by plasma CVD.

The operation of the magneto-resistive effect memory cell 3101 produced in this manner was confirmed in the following manner.

A pulse current 531 shown in FIG. 9A was caused to flow in the conductive film 170 (word line) to magnetize the hard magnetic film 110 in one direction. Then, a pulse current 532 (upper portion in FIG. 9B) was caused to flow in the conductive film 170, and a change in the voltage value ($\Delta R_S/\Delta t$) of the magneto-resistive effect memory cell 3101 measured through the conductive films 140 and 150 was monitored. As a result, a voltage change 533 (lower portion in FIG. 9B) corresponding to the written information was detected. Thus, it was found that the desired magneto-resistive effect memory cell 3101 using an insulating film for a nonmagnetic film was realized.

The nonlinear element 70 can have an M-I-S structure described below in a tenth example. As the nonlinear element 70, any element which exhibits a nonlinear current—voltage characteristic is usable. The MR portion 100 can be replaced with the MR portion 101 (FIG. 3).

In this example, $Fe_{16}N_2$ was used as a nitride for the ferromagnetic film 110. The magneto-resistive effect memory cell 3101 has been confirmed to perform a desired operation even when $FeN_x$ ($0.1 \leq x \leq 0.5$) or $FeMN_y$ ($0.5 \leq y \leq 1.0$) is used (M indicates one of Ta, Al, Ni, Pt and Co). In this example, AlN was used as a nitride for the nonmagnetic insulating film 120. The magneto-resistive effect memory cell 3101 has been confirmed to provide similar characteristics even when other nitrides are used. These results are shown in Table 1.

TABLE 1

| Nonmagnetic insulating film NM | Film thickness (nm) | Element area ($\mu m^2$) | Element resistance (Ohm) | Change ratio in magnetic resistance (%) |
|---|---|---|---|---|
| BN | 3 | 0.64 | 136 | 23 |
| InN | 3 | 0.64 | 104 | 21 |
| AlN | 1.5 | 0.64 | 90 | 29 |
| AlN (O)* | 1.5 | 0.64 | 165 | 32 |
| AlN/BN (O)** | 2 | 0.64 | 180 | 35 |

(The MR portion was formed to have a structure of $Ni_{0.81}Fe_{0.19}$ (25)/$Co_{0.5}Fe_{0.5}$ (4)/NM/$Fe_{16}N_2$ (5)/IrMn (25).
*"(O)" indicates that oxidization was performed after nitrided.
**"/" indicates a laminate.

EXAMPLE 10

In a tenth example according to the present invention, a method for producing a magneto-resistive effect memory cell 3102 based on the magneto-resistive effect memory cell 3100 (FIG. 7) shown in the third example will be described.

Figure 16B:
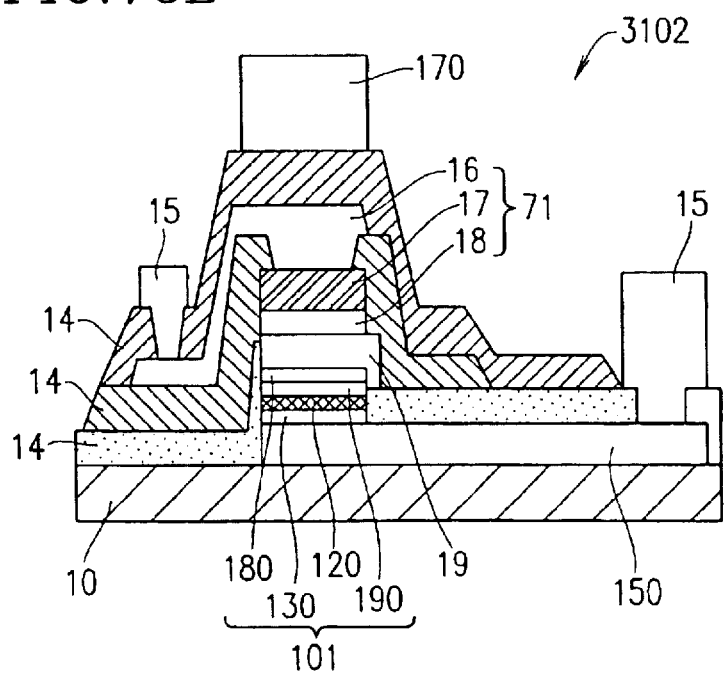

The magneto-resistive effect memory cell 3102 shown in FIG. 16B was produced by a method similar to that of the ninth example.

The MR portion 101 having a basic structure of $Fe_{16}N_2$ (10)/AlN (1.8)/$Fe_{16}N_2$ (5)/IrMn (25) was produced using, as sputtering targets, $Fe_{16}N_2$ (for the soft magnetic film 130), Al (for the nonmagnetic insulating film 120), $Fe_{16}N_2$ (for the ferromagnetic film 190), and IrMn (for the magnetization rotation prevention layer as the antiferromagnetic film 180).

AlN was formed by plasma nitriding using ECR (electron cyclotron resonance). A contact layer 19 was formed of Al, Cr or Ti on the MR portion 101. A nonlinear element 71 having an M-I-S junction was formed of a-Si on the contact layer 19. An Si film (S layer) 18 and an insulating film (I layer) 17 were formed to have thicknesses of about 50 nm and about 100 to 200 nm, respectively. A metal film (M layer) 16 was used as a sense line (or a bit line). The nonlinear element 71 was formed in a temperature range of about 180° C. to about 260° C. (typically, about 220° C.).

The interface between the AlN film and the $Fe_{16}N_2$ film was observed to be very flat and satisfactory. This reflects a satisfactory junction compatibility of AlN and $Fe_{16}N_2$, which are both nitrides.

Figure 17:
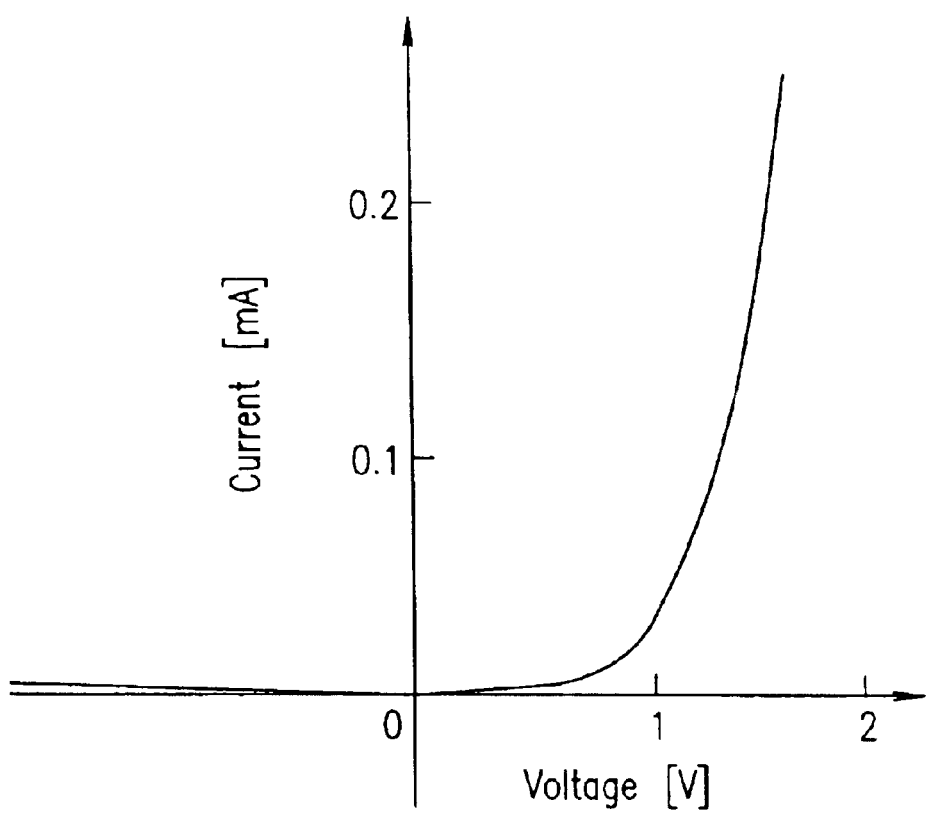
FIG. 17 is a graph illustrating a current—voltage characteristic of a magneto-resistive effect memory cell in an example according to the present invention.

The MR characteristics of the resultant magneto-resistive effect memory cell 3102 were measured at room temperature at an applied magnetic field of 100 Oe. The MR ratio was about 38%, the tunnel junction area was about 5 $\mu m^2$, and the tunnel junction impedance was about 20Ω. Such superior MR characteristics are considered to be a result of influence of the heat treatment performed for producing the nonlinear element 71. The magneto-resistive effect memory cell 3102 has an asymmetric current—voltage characteristic shown in FIG. 17. It has been confirmed that the current with respect to the voltage applied to the magneto-resistive effect memory cell 3102 is provided with asymmetric directivity.

The conductive film 150 was formed of TiN. TiN is highly compatible with $Fe_{16}N_2$ and thus contacts $Fe_{16}N_2$ in a satisfactory manner. Therefore, the contact resistance was reduced by about 20% when TiN was used than when Au was used, although TiN has a higher specific resistance than that of Au. The conductive film 170 was formed of AuCr. The insulating film for insulating the MR portion 101 and the nonlinear element 71 and for insulating the nonlinear element 71 and the conductive film 170 was formed of $SiO_2$ obtained by plasma CVD.

The operation of the magneto-resistive effect memory cell 3102 produced in this manner was confirmed in the following manner.

A pulse current 541 shown in FIG. 10A was caused to flow in the conductive film 170 to magnetize the soft magnetic film 130 in one direction. Then, a pulse current 542 (upper portion in FIG. 10B) was caused to flow in the conductive film 170, and a change in the voltage value ($\Delta V_1$) of the magneto-resistive effect memory cell 3102 measured through the metal film 16 and the conductive film 150 was monitored. As a result, a pulse 543 (lower portion in FIG. 10B) corresponding to the written information was detected. Thus, it was found that the desired magneto-resistive effect memory cell 3102 was realized.

In this example, a nitride of Fe was used as a ferromagnetic material. The magneto-resistive effect memory cell 3102 has been confirmed to perform a desired operation even when a nitride of Co is used.

EXAMPLE 11

In an eleventh example according to the present invention, a method for producing a magneto-resistive effect memory cell 4000 shown in the fourth example will be described.

The magneto-resistive effect memory cell 4000 shown in FIGS. 8A through 8D was produced by a method similar to that of the fifth example. The MR portion 200 was produced using, as sputtering targets, $Ni_{0.68}Co_{0.2}Fe_{0.12}$ for the soft magnetic films 132, 133 and 134, Al for the nonmagnetic insulating films 122, 123 and 124, and $Co_{0.5}Fe_{0.5}$ and $Co_{0.9}Fe_{0.1}$ for the hard magnetic films 112, 113 and 114 having different magnetic coersive forces. Under the conditions used by the present inventors to produce the magneto-resistive effect memory cell 4000 in this example, the magnitudes of the magnetic coersive forces had a relationship of $Co_{0.9}Fe_{0.1} < Co_{0.5}Fe_{0.5} < Co$.

The resultant MR portion 200 had a triple-junction array of $Ni_{0.68}Co_{0.2}Fe_{0.12}$ (10)/AlN (1.5)/Co (15)/AlN (15)/ $Ni_{0.68}Co_{0.2}Fe_{0.12}$ (10)/AlN (1.5)/$Co_{0.9}F_{0.5}$ (15)/AlN (15)/ $Ni_{0.68}Co_{0.2}Fe_{0.12}$ (10)/AlN (1.5)/$Co_{0.9}Fe_{0.1}$ (15). AlN was produced by the method described in the fifth example. The MR characteristics of the MR portion 200 were measured at room temperature at an applied magnetic field of 100 Oe. The MR ratio of the array was about 28%. The tunnel junction area was about 2 $\mu m^2$.

The conductive films used as the sense lines and bit lines (conductive films similar to the conductive films 140 and 150; not shown in FIGS. 8A through 8D) were formed of Au, and the conductive film 172 used as the word lines was formed of AuCr. The insulating film for insulating the MR portion 200 and the conductive film 172 was formed of $SiO_2$.

The operation of the magneto-resistive effect memory cell 4000 produced in this manner was confirmed in the following manner.

Figure 18A:
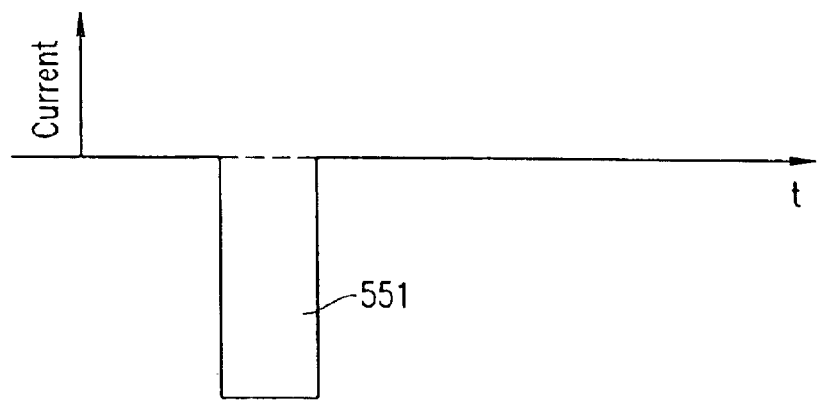
FIGS. 18A and 18B shows an operation of a magneto-resistive effect memory cell in an example according to the present invention.
Figure 18B:
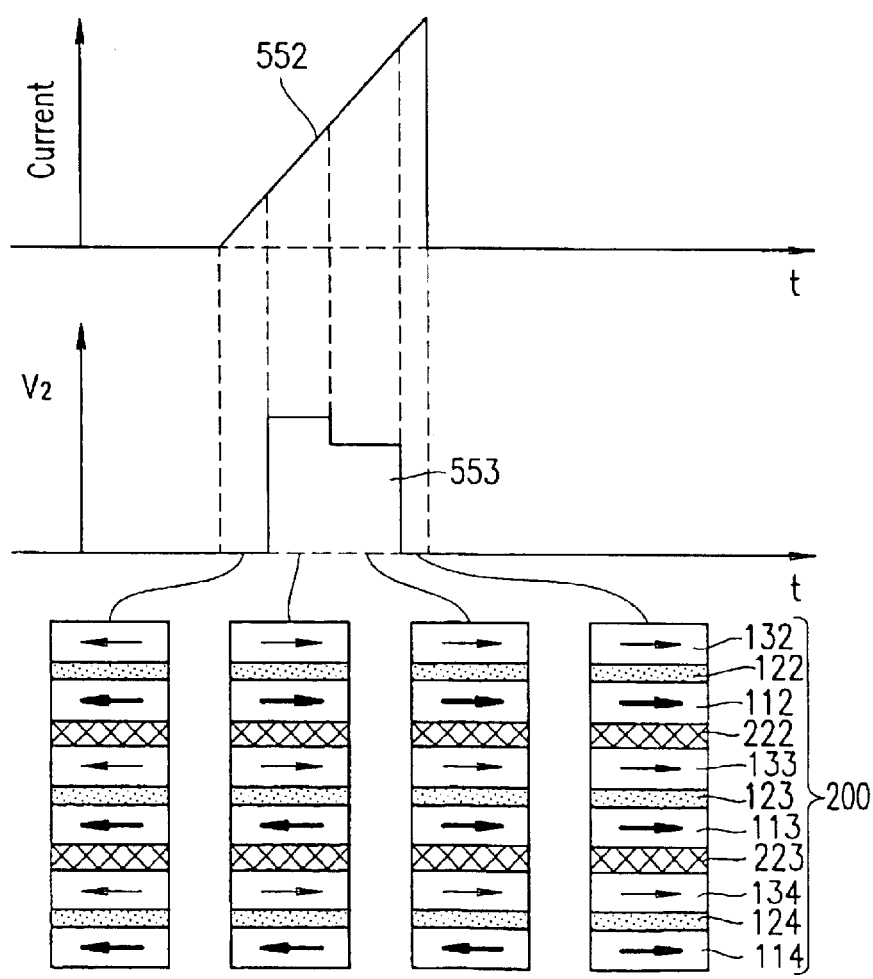

A pulse current 551 shown in FIG. 18A was caused to flow in the conductive film 172 to magnetize the hard magnetic films 112, 113 and 114 in one direction. Then, an inclining pulse current 552 (upper portion in FIG. 18B) was caused to flow in the conductive film 172 to cause inversion of magnetization direction in the hard magnetic films 112, 113 and 114, sequentially. Thus, a change in the voltage value $V_2$ measured through the sense lines and the bit lines was monitored. As a result, a pulse 553 (lower portion in FIG. 18B) corresponding to the written information was detected. Thus, it was confirmed that multiple levels of a signal have been stored in the magneto-resistive effect memory cell 4000.

The magneto-resistive effect memory cell 4000 allows multiple levels of a signal to be recorded by applying an appropriate bias voltage. The written information can be detected in accordance with the change in the voltage $V_2$ under a constant bias voltage.

EXAMPLE 12

Figure 19A:
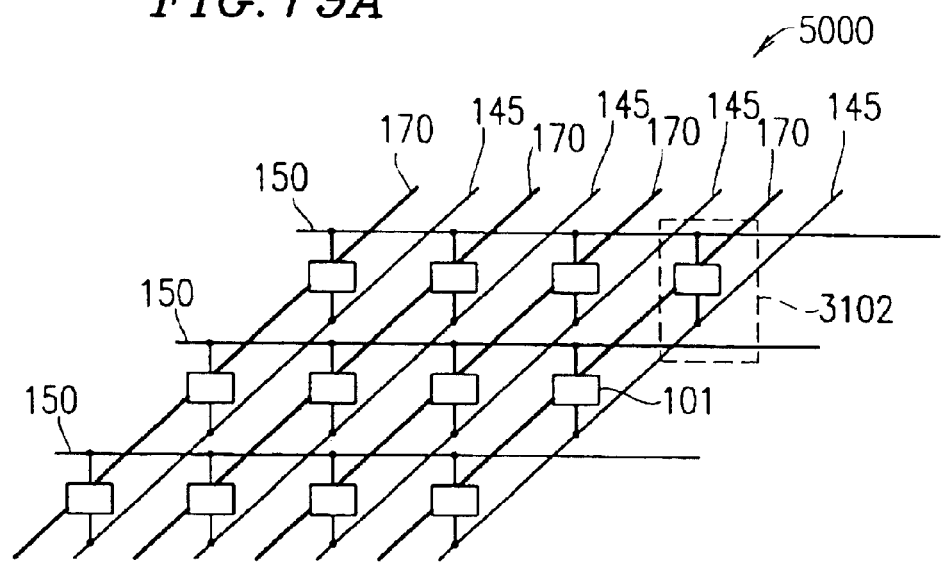
FIG. 19A is an isometric view of an MRAM in an example according to the present invention.
Figure 19B:
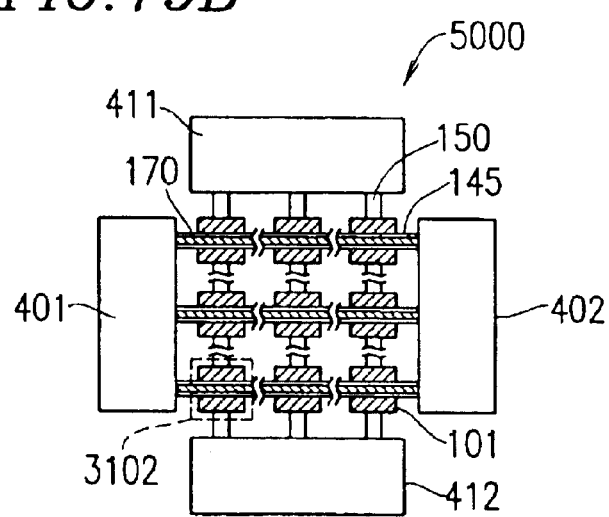
FIG. 19B is a plan view of the MRAM in an example according to the present invention.

FIGS. 19A and 19B shows an MRAM 5000 in a twelfth example according to the present invention.

The MRAM 5000 includes magneto-resistive effect memory cells 3102 (FIG. 16B) described in the tenth example.

Each magneto-resistive effect memory cells 3102 shown in FIG. 16B was produced by a method similar to that of the tenth example.

The MR portion 101 having a basic structure of $Ni_{0.1}Fe_{2.9}O_4$ (5)/AlN (1.2)/$Fe_{16}N_2$ (10)/IrMn (20) was produced using, as sputtering targets. $Ni_{0.2}Fe_{2.9}O_4$ (for the soft magnetic film 130), Al (for the nonmagnetic insulating film 120), $Fe_{16}N_2$ (for the ferromagnetic film 190), and IrMn (for the magnetization rotation prevention layer as the antiferromagnetic film 180).

AlN was formed by the method described in the fifth example. In this example, a contact layer 19 was formed of Al on the MR portion 101. A nonlinear element 71 having a P-I-N Junction was formed of a-Si on the contact layer 19. The nonlinear element 71 in this example includes a P layer instead of the Si film (S layer) 18 shown in FIG. 16B, and an N layer instead of the metal film (M layer) 16.

The nonlinear element 71 was produced in a temperature range of about 180° C. to about 260° C. (typically, about 220° C.). The P layer, the I layer and the N layer were formed to have thicknesses of about 100 to about 200 nm, about 100 to about 200 nm and about 50 nm, respectively.

The interface between the AlN film and the $Fe_{16}N_2$ film was observed to be very flat and satisfactory. This reflects a satisfactory junction compatibility of AlN and $Fe_{16}N_2$, which are both nitrides.

The MR characteristics of the resultant magneto-resistive effect memory cell 3102 were measured at room temperature at an applied magnetic field of 100 Oe. The MR ratio was about 33%, the tunnel junction area was about 2 $\mu m^2$, and the tunnel junction impedance was about 100Ω. Such superior MR characteristics are considered to be a result of influence of the heat treatment performed for producing the nonlinear element 71. The magneto-resistive effect memory cell 3102 has an asymmetric current—voltage characteristic shown in FIG. 17. It has been confirmed that the current with respect to the voltage applied to the magneto-resistive effect memory cell 3102 is provided with asymmetric directivity.

The MRAM 5000 includes a plurality of magneto-resistive effect memory cells 3102, each produced as described above, in a matrix of 256×256.

In the MRAM 5000, a conductive film 145 acting as a sense line (or a bit line) which is electrically connected to the N layer of the nonlinear element 71 was formed of Au, the conductive film 170 was formed of AuCr, and the insulating film for insulating the MR portion 101 and the conductive film 170 was formed of $SiO_2$.

The conductive films 145 and 150 (bit lines and sense lines), the conductive films 170 (word lines) are arranged in a matrix as shown in FIG. 19A. In FIG. 19A, each conductive film 170 is shown as provided on side surfaces of the respective MR portions 101. This is for the sake of convenience for easier explanation. As shown in FIG. 19B, the MRAM 5000 in this example includes the conductive films 145 and the conductive films 170 arranged in the same direction with respect to the MR portions 101. As shown in FIG. 19A, the present invention is applicable to an MRAM having the conductive films 170 provided on side surfaces of the respective MR portions 101. The conductive films 150 and the conductive films 170 can be provided in the same direction with respect to the MR portions 101.

Switch sections 401 and 411 for specifying addresses, and signal detection sections 402 and 412 are arranged as shown in FIG. 19B. The switch sections 401 and 411 select arbitrary conductive films 145, 150 and 170. The signal detection sections 402 and 412 detect a current value or a voltage value of each conductive film.

Information is written in the MR portion 101 as follows. A current pulse is caused to flow in the conductive film 150 as a row element and the conductive film 170 as a column element, and the magnetization state of only a specific MR portion 101 is changed by the resultant synthesized magnetic field. In this example, the conductive film 150 (bit line or sense line) also acts as a word line.

A read operation of the MRAM 5000 in an arbitrary memory state was confirmed in the following manner.

A specific conductive film 145, a specific conductive film 150 and a specific conductive film 170 were selected by the switch sections 401 and 411. The resistance value of the MR portion 101 corresponding to the selected conductive films was monitored. As in the second example, the value of the difference between the monitored resistance value of the MR portion 101 and a reference value was monitored through a differential circuit (not shown; preferably built-in the signal detection sections 402 and 412). The memory state was read in accordance with the value of the difference.

Since the memory state of the MR portion 101 was stored, the read operation was confirmed to be an NDRO operation.

These results showed that the MRAM 5000 according to the present invention was realized.

In this example, the magneto-resistive effect memory cell 3102 having a structure shown in FIG. 16B is described. Alternatively, a desired magneto-resistive effect memory cell and an MRAM according to the present invention can be obtained by using a nonlinear element 71 having a structure as, and located as, the nonlinear element 70 shown in FIG. 16A, and using an MR portion 101 having a structure as the MR portion 100 shown in FIG. 16A. The nonlinear element 71 can have an M-I-S junction shown in FIG. 10. As the nonlinear element 71, any element which exhibits a nonlinear current—voltage characteristic is usable. The MR portion 101 can be replaced with the MR portion 100 (FIG. 1).

EXAMPLE 13

In a thirteenth example according to the present invention, a method for producing the magneto-resistive effect memory cell 1000 shown in the first example will be described.

The magneto-resistive effect memory cell 1000 shown in FIG. 1 was produced by a method similar to that of the fifth example.

Referring to FIG. 1, the MR portion 100 shown in FIG. 1 was produced using, as sputtering targets, $Co_{0.2}Ni_{0.68}Fe_{0.12}$ (for the soft magnetic film 130), Al (for the nonmagnetic insulating film 120), $Co_{0.9}Fe_{0.1}$ (for the hard magnetic film 110), and $Co_{0.75}Pt_{0.25}$ (for the hard magnetic film 110). A multi-origin sputtering apparatus (not shown) was used. The basic structure of the MR portion 100 was CoNiFe (15)/AlN(1)/CoFe (5)/CoPt (25).

In this example, the hard magnetic film 110 has a two-layer structure of CoFe/CoPt.

The MR portion 100 having the above-described structure was produced as follows. CoNiFe was deposited on an Si substrate oxidized by heating. Then, the nonmagnetic insulating film 120 was formed by sputtering Al in an ($N_2$ +Ar) atmosphere. The nonmagnetic insulating film 120 was subjected to spontaneous oxidation in an oxygen atmosphere in a vacuum tank in order to completely insulate a non-insulating portion of the nonmagnetic insulating film 120 through which microshortcircuiting can occur. Each of a nitriding step and an oxidizing step was performed twice, so as to form the nonmagnetic insulating film 120 having a thickness of about 1 nm. By appropriately controlling such processing, satisfactory tunnel characteristics were obtained. Next, the CoFe and CoPt were deposited on the nonmagnetic insulating film 120.

CoPt of the resultant MR portion 100 was magnetized, and the MR characteristics of the MR portion 100 were measured at room temperature at an applied magnetic field of 100 Oe. The MR ratio was about 31%. This value was higher than the MR ratio of a similarly structured MR portion including a nonmagnetic insulating film 120 obtained by performing each of a nitriding step and an oxidizing step once. The magnetic field width represented as Hc and generated by the MR portion 100 was 5 Oe to 100 Oe. The tunnel junction area was about 2 $\mu m^2$. The impedance of the tunnel junction was about 35Ω. It was also found that the impedance of the tunnel junction can be controlled in the range of several ohms to several hundred ohms by changing the film formation conditions.

It was found that the yield of tunnel junction formation is improved by subjecting the nonmagnetic insulating film 120 to a nitriding step and an oxidizing step in repetition as in this example and that the production of the present invention is effective for an element having a tunnel junction.

The magneto-resistive effect memory cell 1000 shown in FIG. 1 including the MR portion 100 obtained as described above was produced. The conductive films 140 and 150 for the sense line and the bit line were formed of Pt or Au, and the conductive film 170 for the word line was formed of Al, AuCr, Ti/Au or Cu/Ta. The insulating film for insulating the MR portion 100 and the conductive film 170 was formed of $CaF_2$ or $SiO_2$.

The operation of the magneto-resistive effect memory cell 1000 produced in this manner was confirmed in the following manner.

A pulse current 531 shown in FIG. 9A was caused to flow in the conductive film 170 (word line) to magnetize the hard magnetic film 110 in one direction. Then, a pulse current 532 (upper portion in FIG. 9B) was caused to flow in the conductive film 170, and a change in the voltage value ($\Delta R_S/\Delta t$) of the magneto-resistive effect memory cell 1000 measured through the conductive films 140 and 150 (sense a line and bit line) was monitored. As a result, a pulse 533 (lower portion in FIG. 9B) corresponding to the written information was detected. Thus, it was found that the desired magneto-resistive effect memory cell 1000 was realized.

EXAMPLE 14

In a fourteenth example according to the present invention, a method for producing a magneto-resistive effect head 6000 shown in the third example will be described.

The magneto-resistive effect head 6000 shown in FIGS. 20A and 20B was produced by a method similar to that of the fifth example. FIG. 20A is an isometric view of the magneto-resistive effect head 6000, and FIG. 20B is a cross-sectional view thereof.

The MR portion 101 having a basic structure of NiFe (20)/CoNiFe (8)/AlN (0.6)/CoFe (6)/IrMn (25) was produced using, as sputtering targets, $Ni_{0.81}Fe_{0.19}$ and $Ni_{0.68}Co_{0.2}Fe_{0.12}$ (for the soft magnetic film 130), Al (for the nonmagnetic insulating film 120), $Co_{0.75}Fe_{0.25}$ (for the ferromagnetic film 190), and IrMn (for the magnetization rotation prevention layer as the antiferromagnetic film 180).

The nonmagnetic insulating film 120 was formed by sputtering Al in an ($N_2$+Ar) atmosphere. The MR characteristics of the resultant MR portion 101 were measured at room temperature at an applied magnetic field of 100 Oe. The MR ratio was about 25%. The tunnel junction area was about 3 $\mu m^2$. The impedance of the tunnel junction was about 10 Ω.

The magneto-resistive effect head 6000 including the MR portion 101 thus obtained was produced.

With reference to FIGS. 20A and 20B, the magneto-resistive effect head 6000 includes a substrate 601, for a slider, formed of a sintered material containing $Al_2O_3$. TiC as a main component, shield layers 602 and 603, writing magnetic poles 605 and 606 formed of an NiFe alloy, a coil 607 formed of Cu, and gap layers 608 formed of $Al_2O_3$. The gap layers 608 are located between two adjacent layers. The shield layers 602 and 603 each have a thickness of about 1 $\mu$m. The writing magnetic poles 605 and 606 each have a thickness of about 3 $\mu$m. The gap layers 608 of $Al_2O_3$ between the shield layer 602 and the MR portion 101 and between the shield layer 603 and the MR portion 101 each have a thickness of about 0.1 $\mu$m, and the gap layer 608 between writing magnetic poles 605 and 606 is about 0.2 $\mu$m. The distance between the conductive layer 150 and the writing magnetic pole 605 is about 4 $\mu$m, and the coil 607 has a thickness of about 3 $\mu$m.

The MR portion 101 is located between the shield layers 602 and 603, and is not exposed to a surface 604 of the magneto-resistive effect head 6000.

A bias current is applied to the MR portion 101 through the conductive films 141 and 150. The soft magnetic fill films 130 and the ferromagnetic film 190 which are located so as to interpose the nonmagnetic insulating film 120 are set to have magnetization directions directed perpendicular to each other. Thus, changes in the magnetization direction corresponding to reproduction signals are detected at a sufficiently high sensitivity.

As shown in FIGS. 21A and 21B, a magnetic disk apparatus 7000 including magneto-resistive effect heads 6000 was produced. FIG. 21A is a plan view of the magnetic disk apparatus 7000, and FIG. 21B is a cross-sectional view of the magnetic disk apparatus 7000.

A magnetic recording medium 701 is formed of a Co-Ni-Pt-Ta alloy. The magneto-resistive effect head 6000 is supported by a magnetic head supporting section 702, and driven by a magnetic head driving section 703. The tracking width of the magneto-resistive effect head 6000 is set to be 5 $\mu$m. As shown in FIG. 21B, the magnetic disk apparatus 7000 includes a plurality of magneto-resistive effect head 6000 having the above-described structure.

The magneto-resistive effect head 7000 according to the present invention has a higher resistance change ratio than a GMR magneto-resistive effect head which is a conventional CIPMR element. Accordingly, the magneto-resistive effect head 6000 has a sufficiently large reproduction output and thus is very effective as a magnetic head for reproduction. The magneto-resistive effect head 6000 also has a lower impedance. Since the resultant magnetic disk apparatus 7000 detected voltage changes corresponding to the information recorded in the magnetic recording medium 701 in a satisfactory manner, it was found that the magneto-resistive effect head 6000 according to the present invention was realized.

The MR portions 100, 101, 102 and 200 described in all the examples in this specification are usable as a magneto-resistive effect head as described in this example.

Industrial Application

As described above, according to the present invention, a magneto-resistive effect memory cell and a magneto-resistive effect head both having satisfactory tunnel characteristics can be produced by using an insulating film of a nitride as a nonmagnetic insulating film. In the case where the ferromagnetic film is also formed of a nitride, the quality of the tunnel junction interface is improved, which is more preferable.

A magneto-resistive effect memory cell, a magneto-resistive effect head, and a method for producing the same according to the present invention allow the impedance of the tunnel junction to be low. Therefore, a magneto-resistive effect memory cell and a magneto-resistive effect head having a very fine pattern can be provided.

A feature of the present invention is to use a nitride for a nonmagnetic insulating film, and also for a magnetic film. In this manner, a magneto-resistive element, a magneto-resistive effect magnetic head, a magneto-resistive effect memory element, and a high density magneto-resistive effect memory device including such magneto-resistive effect memory elements in a matrix, which have a reduced tunnel junction resistance and an ideal tunnel junction interface, are provided.

Especially, the nonmagnetic insulating film is formed of a combination of a nitride and an oxide. Thus, the advantage of a low tunnel junction resistance of the nonmagnetic insulating film formed of a nitride can be used. In addition, an incompletely nitrided portion of the nonmagnetic insulating film, which tends to be made as a result of dispersion in the production conditions, is oxidized so as to increase the resistance of the incompletely nitrided portion. Thus, a leak conveying path or a hopping conveyance path can be prevented from appearing. In the case where the nonmagnetic insulating film is formed by repeating a nitriding step and an oxidizing step in repetition, the controllability of the tunnel characteristics can be further improved.

According to the present invention, a low junction resistance, which is equivalent to a tunnel junction resistance obtained by using $Al_2O_3$ for the nonmagnetic insulating film, is realized with a thicker nonmagnetic insulating film. Therefore, the MR portion can be more easily produced, which is advantageous in uniformizing the characteristics of memory cells which are required to be highly integrated.

What is claimed is:

1. A magneto-resistive effect memory element, comprising:
    a first ferromagnetic film;
    a second ferromagnetic film;
    a first nonmagnetic film provided between the first ferromagnetic film and the second ferromagnetic film;
    a first conductive film for generating a magnetic field for causing magnetization inversion in at least one of the first ferromagnetic film and the second ferromagnetic film, the first conductive film not being electrically in contact with the first ferromagnetic film or the second ferromagnetic film; and
    a second conductive film and a third conductive film for supplying an electric current to the first ferromagnetic film, the first nonmagnetic film, and the second ferromagnetic film,
    wherein:
        the first ferromagnetic film and the second ferromagnetic film have different magnetization inversion characteristics with respect to the magnetic field, and
        the first nonmagnetic film contains at least a nitride.

2. A magneto-resistive effect memory element according to claim 1, wherein at least one of the first ferromagnetic film and the second ferromagnetic film contains a nitride.

3. A magneto-resistive effect memory element according to claim 2, wherein at least one of the first ferromagnetic film and the second ferromagnetic film contains a nitride which contains at least one of Fe and Co as a main component.

4. A magneto-resistive effect memory element according to claim 1, wherein at least one of the second conductive film and the third conductive film contains a nitride.

5. A magneto-resistive effect memory element according to claim 4, wherein at least one of the second conductive film and the third conductive film contains TiN.

6. A magneto-resistive effect memory element according to claim 1, wherein the first nonmagnetic film has a thickness of 0.5 nm to 4 nm.

7. A magneto-resistive effect memory element according to claim 1, wherein the first nonmagnetic film contains AlN.

8. A nagneto-resistive effect memory element according to claim 1, wherein the first nonmagnetic film contains BN.

9. A magneto-resistive effect memory element according to claim 1, wherein the first nonmagnetic film contains InN.

10. A magneto-resistive effect memory element according to claim 1, wherein the first nonmagnetic film contains at least M—N—(O) where M is at least one metal element of Al, B and In, N is a nitrogen element, and (O) is an oxygen element contained in the nitride.

11. A magneto-resistive effect memory element according to claim 10, wherein the first nonmagnetic film mainly contains M—N, and mainly contains M—O in a grain boundary thereof.

12. A magneto-resistive effect memory element according to claim 10, wherein the first nonmagnetic film mainly contains M—N, and also contains M—O in a dispersed manner.

13. A magneto-resistive effect memory element according to claim 1, wherein the first nonmagnetic film is formed by nitriding a nonmagnetic metal material.

14. A magneto-resistive effect memory element according to claim 1, wherein the first nonmagnetic film further contains an oxide.

15. A magneto-resistive effect memory element according to claim 1, wherein the first nonmagnetic film mainly includes at least one M—N film and at least one M—O film, where M is at least one metal element of Al, B and In, N is a nitrogen element, and O is an oxygen element.

16. A method for producing a magneto-resistive effect memory element, wherein the magneto-resistive effect memory element comprises,
    a first ferromagnetic film;
    a second ferromagnetic film;
    a first nonmagnetic film provided between the first ferromagnetic film and the second ferromagnetic film, the first nonmagnetic film containing an oxide;
    a first conductive film for generating a magnetic field for causing magnetization inversion in at least one of the first ferromagnetic film and the second ferromagnetic film, the first conductive film not being electrically in contact with the first ferromagnetic film or the second ferromagnetic film; and
    a second conductive film and a third conductive film for supplying an electric current to the first ferromagnetic film, the first nonmagnetic film, and the second ferromagnetic film,
    wherein,
        the first ferromagnetic film and the second ferromagnetic film have different magnetization inversion characteristics with respect to the magnetic field, and
        the first nonmagnetic film contains at least a nitride, the method comprising:
            a first step of forming the first nonmagnetic film by nitriding a nonmagnetic metal material in a nitrogen atmosphere; and
            a second step of oxidizing the first nonmagnetic film in an oxygen atmosphere.

17. A method for producing a magneto-resistive effect memory element according to claim 16, wherein at least one of the first step and the second step is performed a plurality of times.

18. A method for producing a magneto-resistive effect memory element according to claim 16, further comprising:
a third step of forming the first ferromagnetic film; and
a fourth step of forming the second ferromagnetic film.

19. A method for producing a magneto-resistive effect memory element, wherein the magneto-resistive effect memory element comprises,
a first ferromagnetic film;
a second ferromagnetic film;
a first nonmagnetic film provided between the first ferromagnetic film and the second ferromagnetic film, wherein the first nonmagnetic film contains at least M—N—(O) where M is at least one metal element of Al, B and In, N is a nitrogen element, and (O) is an oxygen element contained in the nitride, and wherein the first nonmagnetic film mainly contains M—N, and mainly contains M—O in a grain boundary thereof;
a first conductive film for generating a magnetic field for causing magnetization inversion in at least one of the first ferromagnetic film and the second ferromagnetic film, the first conductive film not being electrically in contact with the first ferromagnetic film or the second ferromagnetic film: and
a second conductive film and a third conductive film for supplying an electric current to the first ferromagnetic film, the first nonmagnetic film, and the second ferromagnetic film,
wherein
the first ferromagnetic film and the second ferromagnetic film have different magnetization inversion characteristics with respect to the magnetic field, and
the first nonmagnetic film contains at least a nitride, the method comprising:
a first step of forming the first nonmagnetic film by nitriding a nonmagnetic metal element in a nitrogen atmosphere, and
a second step of oxidizing the first nonmagnetic film in an oxygen atmosphere.

20. A method for producing a magneto-resistive effect memory element according to claim 19, wherein at least one of the first step and the second step is performed a plurality of times.

21. A method for producing a magneto-resistive effect memory element according to claim 19, further comprising:
a third step of forming the first ferromagnetic film; and
a fourth step of forming the second ferromagnetic film.

22. A method for producing a magneto-resistive effect memory element, wherein the magneto-resistive effect memory element comprises,
a first ferromagnetic film;
a second ferromagnetic film;
a first nonmagnetic film provided between the first ferromagnetic film and the second ferromagnetic film, wherein the first nonmagnetic film contains at least M—N—(O) where M is at least one metal element of Al, B and In, N is a nitrogen element, and (O) is an oxygen element contained in the nitride, and wherein the first nonmagnetic film mainly contains M—N, and also contains M—O in a dispersed manner;
a first conductive film for generating a magnetic field for causing magnetization inversion in at least one of the first ferromagnetic film and the second ferromagnetic film, the first conductive film not being electrically in contact with the first ferromagnetic film or the second ferromagnetic film; and
a second conductive film and a third conductive film for supplying an electric current to the first ferromagnetic film, the first nonmagnetic film, and the second ferromagnetic film.
wherein,
the first ferromagnetic film and the second ferromagnetic film have different magnetization inversion characteristics with respect to the magnetic field, and
the first nonmagnetic film contains at least a nitride, the method comprising:
a first step of forming the first nonmagnetic film by nitriding the metal element in a nitrogen atmosphere; and
a second step of oxidizing the first nonmagnetic film in an oxygen atmosphere.

23. A method for producing a magneto-resistive effect memory element according to claim 22, wherein at least one of the first step and the second step is performed a plurality of times.

24. A method for producing a magneto-resistive effect memory element according to claim 22, further comprising:
a third step of forming the first ferromagnetic film; and
a fourth step of forming the second ferromagnetic film.

25. A method for producing a magneto-resistive effect memory element, wherein the magneto-resistive effect memory element comprises,
a first ferromagnetic film;
a second ferromagnetic film;
a first nonmagnetic film provided between the first ferromagnetic film and the second ferromagnetic film, wherein the first nonmagnetic film mainly includes at least one M—N film and at least one M—O film, where M is at least one metal element of Al, B and In, N is a nitrogen element, and O is an oxygen element;
a first conductive film for generating a magnetic field for causing magnetization inversion in at least one of the first ferromagnetic film and the second ferromagnetic film, the first conductive film not being electrically in contact with the first ferromagnetic film or the second ferromagnetic film; and
a second conductive film and a third conductive film for supplying an electric current to the first ferromagnetic film, the first nonmagnetic film, and the second ferromagnetic film,
wherein.
the first ferromagnetic film and the second ferromagnetic film have different magnetization inversion characteristics with respect to the magnetic field, and
the first nonmagnetic film contains at least a nitride, the method comprising:
a first step of forming the at least one M—N film by nitriding the metal element in a nitrogen atmosphere; and
a second step of forming the at least one M—O film by oxidizing the metal element in an oxygen atmosphere.

26. A method for producing a magneto-resistive effect memory element according to claim 25, wherein at least one of the first step and the second step is performed a plurality of times.

27. A method for producing a magneto-resistive effect memory element according to claim 25, further comprising:
a third step of forming the first ferromagnetic film; and
a fourth step of forming the second ferromagnetic film.

28. A magneto-resistive effect memory device, comprising:

a plurality of magneto-resistive effect memory elements, wherein each of the magneto-resistive effect memory element, comprises, a first ferromagnetic film:

a second ferromagnetic film;

a first nonmagnetic film provided between the first ferromagnetic film and the second ferromagnetic film;

a first conductive film for generating a magnetic field for causing magnetization inversion in at least one of the first ferromagnetic film and the second ferromagnetic film, the first conductive film not being electrically in contact with the first ferromagnetic film or the second ferromagnetic film; and a second conductive film and a third conductive film for supplying an electric current to the first ferromagnetic film, the first nonmagnetic film, and the second ferromagnetic film, wherein, the first ferromagnetic film and the second ferromagnetic film have different magnetization inversion characteristics with respect to the magnetic field, and the first nonmagnetic film contains at least a nitride, wherein a plurality of first conductive films, a plurality of second conductive films, and a plurality of third conductive films are each located in a prescribed direction.

29. A magneto-resistive effect memory element, comprising:

a plurality of stacking structures;

at least one first nonmagnetic film provided between the plurality of stacking structures; and a first conductive film and a second conducive film for supplying an electric current to the plurality of standing structures, wherein:

the plurality of stacking structures each have a first ferromagnetic film, a second ferromagnetic film, and a second nonmagnetic film provided between the first ferromagnetic film and the second ferromagnetic film, the first ferromagnetic film and the second ferromagnetic film have different magnetization inversion characteristics with respect to a magnetic field, the magneto-resistive effect memory element further includes a third conductive film for generating a magnetic field for causing magnetization inversion in at least one of the first ferromagnetic films and the second ferromagnetic films included in the plurality of stacking structures, the third conductive film not being electrically in contact with the first ferromagnetic films or the second ferromagnetic films, and at least one of the second nonmagnetic film included in the plurality of stacking structures contains at least a nitride.

30. A magneto-resistive effect memory element according to claim 29, wherein the first ferromagnetic films have different magnitudes of magnetic coersive forces.

31. A magneto-resistive effect memory element according to claim 29, wherein the second ferromagnetic films have different magnitudes of magnetic coersive forces.

32. A magneto-resistive effect memory element according to claim 29, wherein the at least one of the first ferromagnetic films and the second ferromagnetic films contains a nitride.

33. A magneto-resistive effect memory element according to claim 32, wherein at least one of the first ferromagnetic films and the second ferromagnetic films contains a nitride which contains at least one of Fe and Co as a main component.

34. A magneto-resistive effect memory element according to claim 29, wherein the at least one of the first conductive film and the second conductive film contains a nitride.

35. A magneto-resistive effect memory element according to claim 34, wherein the at least one of the first conductive film and the second conductive film contains TIN.

36. A magneto-resistive effect memory element according to claim 29, wherein at least one of the second nonmagnetic films contains at least M—N—(O) where M is at least one metal element of Al, B and In, N is a nitrogen element, and (O) is an oxygen element contained in the nitride.

37. A magneto-resistive effect memory element according to claim 29, wherein at least one of the second nonmagnetic films is formed by nitriding a nonmagnetic metal material.

38. A magneto-resistive effect memory element according to claim 29, wherein at least one of the second nonmagnetic films contains an oxide.

39. A magneto-resistive effect memory device, comprising:

a plurality of magneto-resistive effect memory elements, wherein each of the magneto-resistive effect memory element comprises, a plurality of stacking structures;

at least one first nonmagnetic film provided between the plurality of stacking structures; and a first conductive film and a second conductive film for supplying an electric current to the plurality of stacking structures, wherein, the plurality of stacking structures each have a first ferromagnetic film, a second ferromagnetic film, and a second nonmagnetic film provided between the first ferromagnetic film and the second ferromagnetic film, the first ferromagnetic film and the second ferromagnetic film have different magnetization inversion characteristics with respect to a magnetic field, the magneto-resistive effect memory element further includes a third conductive film for generating a magnetic field for causing magnetization inversion in at least one of the first ferromagnetic films and the second ferromagnetic films included in the plurality of stacking structures, the third conductive film not being electrically in contact with the first ferromagnetic films or the second ferromagnetic films, and at least one of the second nonmagnetic film included in the plurality of stacking structures contains at least a nitride, wherein a plurality of first conductive films, a plurality of second conductive films, and a plurality of third conductive films are each located in a prescribed direction.

40. A method for producing a magneto-resistive effect element, wherein the magneto-resistive effect element comprises, a first ferromagnetic film;

a second ferromagnetic film; and a first nonmagnetic film provided between the first ferromagnetic film and the second ferromagnetic film, wherein the first nonmagnetic film further contains an oxide, wherein, the first ferromagnetic film and the second ferromagnetic film have different magnetization inversion characteristics with respect to a magnetic field, and the first nonmagnetic film contains at least a nitride, the method comprising:
- a first step of forming the first nonmagnetic film by nitriding a nonmagnetic metal material in a nitrogen atmosphere; and
- a second step of oxidizing the first nonmagnetic film in an oxygen atmosphere.

41. A method for producing a magneto-resistive effect element according to claim 40, wherein at least one of the first step and the second step is performed a plurality of times.

42. A method for producing a magnet-resistive effect element according to claim 40, further comprising:
- a third step of forming the first ferromagnetic film; and
- a fourth step of forming the second ferromagnetic film.

43. A method for producing a magneto-resistive effect element, wherein the magneto-resistive effect element comprises,
- a first ferromagnetic film;
- a second ferromagnetic film; and
- a first nonmagnetic film provided between the first ferromagnetic film and the second ferromagnetic film, wherein the first nonmagnetic film contains at least M—N—(O) where M is at least one metal element of Al, B and In, N is a nitrogen element, and (O) is an oxygen element contained in the nitride, and wherein the first nonmagnetic film mainly contains M—N, and mainly contains M—O in a grain boundary thereof, wherein,
- the first ferromagnetic film and the second ferromagnetic film have different magnetization inversion characteristics with respect to a magnetic field, and
- the first nonmagnetic film contains at least a nitride, the method comprising:
  - a first step of forming the first nonmagnetic film by nitriding the metal element in a nitrogen atmosphere; and
  - a second step of oxidizing the first nonmagnetic film in an oxygen atmosphere.

44. A method for producing a magneto-resistive effect element according to claim 43, wherein at least one of the first step and the second step is performed a plurality of times.

45. A method for producing a magneto-resistive effect element according to claim 43, further comprising:
- a third step of forming the first ferromagnetic film; and
- a fourth step of forming the second ferromagnetic film.

46. A method for producing a magneto-resistive effect element, wherein the magneto-resistive effect element comprises,
- a first ferromagnetic film;
- a second ferromagnetic film; and
- a first nonmagnetic film provided between the first ferromagnetic film and the second ferromagnetic film wherein the first nonmagnetic film contains at least M—N—(O) where M is at least one metal element of Al, B and In, N is a nitrogen element, and (O) is an oxygen element contained in the nitride, and wherein the first nonmagenetic film mainly contains M—N, and also contains M—O in a dispersed manner, wherein,
- the first ferromagnetic film and the second ferromagnetic film have different magnetization inversion characteristics with respect to a magnetic field, and
- the first nonmagnetic film contains at least a nitride, the method comprising:
  - a first step of forming the first nonmagnetic film by nitriding the metal element in a nitrogen atmosphere; and
  - a second step of oxidizing the first nonmagnetic film in an oxygen atmosphere.

47. A method for producing a magneto-resistive effect element according to claim 46, wherein at least one of the first step and the second step is performed a plurality of times.

48. A method for producing a magneto-resistive effect element according to claim 46, further comprising:
- a third step of forming the first ferromagnetic film; and
- a fourth stop of forming the second ferromagnetic film.

49. A method for producing a magneto-resistive effect element, wherein the magneto-resistive effect element comprises,
- a first ferromagnetic film;
- a second ferromagnetic film; and
- a first nonmagnetic film provided between the first ferromagnetic film and the second ferromagnetic film, wherein the first nonmagnetic film mainly includes at least one M—N film and at least one M—O film, where M is at least one metal element of Al, B and In, N is a nitrogen element, and O is an oxygen element, wherein,
- the first ferromagnetic film and the second ferromagnetic film have different magnetization inversion characteristics with respect to a magnetic field, and
- the first nonmagnetic film contains at least a nitride, the method comprising:
  - a first step of forming the at least one M—N film by nitriding the metal element in a nitrogen atmosphere; and
  - a second step of forming the at least one M—O film by oxidizing the metal element in an oxygen atmosphere.

50. A method for producing a magneto-resistive effect element according to claim 49, wherein at least one of the first step and the second step is performed a plurality of times.

51. A method for producing a magneto-resistive effect element according to claim 49, further comprising:
- a third step of forming the first ferromagnetic film; and
- a fourth step of forming the second ferromagnetic film.

* * * * *